United States Patent
Behera et al.

(10) Patent No.: US 11,592,786 B1
(45) Date of Patent: Feb. 28, 2023

(54) TIME-TO-DIGITAL CONVERTER (TDC) MEASURING PHASE DIFFERENCE BETWEEN PERIODIC INPUTS

(71) Applicant: Shaoxing Yuanfang Semiconductor Co., Ltd., Shaoxin (CN)

(72) Inventors: Debasish Behera, Bangalore (IN); Raja Prabhu J, Bangalore (IN); Girisha Angadi Basavaraja, Bangalore (IN); Nandakishore Palla, Bangalore (IN); Manikanta Sakalabhaktula, Bangalore (IN); Chandrashekar Bg, Bangalore (IN); Sudarshan Varadarajan, Bangalore (IN)

(73) Assignee: Shaoxing Yuanfang Semiconductor Co., Ltd., Zhejiang (CN)

( * ) Notice: Subject to any disclaimer, the term of this patent is extended or adjusted under 35 U.S.C. 154(b) by 0 days.

(21) Appl. No.: 17/662,667

(22) Filed: May 10, 2022

(51) Int. Cl.
*G04F 10/00* (2006.01)
*H03L 7/099* (2006.01)
*H03L 7/091* (2006.01)

(52) U.S. Cl.
CPC ............ *G04F 10/005* (2013.01); *H03L 7/091* (2013.01); *H03L 7/0992* (2013.01); *H03L 2207/50* (2013.01)

(58) Field of Classification Search
CPC ..... G04F 10/005; H03L 7/091; H03L 7/0992; H03L 2207/50
See application file for complete search history.

(56) References Cited

U.S. PATENT DOCUMENTS

| | | | |
|---|---|---|---|
| 7,071,751 B1 | 7/2006 | Kaviani | |
| 9,092,013 B2 | 7/2015 | Song et al. | |
| 9,405,024 B2 | 8/2016 | Frach et al. | |
| 10,496,041 B2 | 12/2019 | Yao et al. | |
| 10,505,554 B2* | 12/2019 | Janardhanan | H03L 7/091 |
| 10,567,154 B1* | 2/2020 | Wentzloff | H03L 7/0995 |
| 10,671,025 B2 | 6/2020 | Mautner et al. | |
| 10,819,355 B1* | 10/2020 | Abughazaleh | H03L 7/0992 |
| 10,868,541 B1 | 12/2020 | Choi et al. | |

(Continued)

OTHER PUBLICATIONS

M. Skandar Basrour et al., "Time-to-Digital Conversion based on a Self-Timed Ring Oscillator" Nov. 20, 2019, 145 pages.

(Continued)

*Primary Examiner* — Adam D Houston
(74) *Attorney, Agent, or Firm* — IPHorizons PLLC; Narendra Reddy Thappeta

(57) ABSTRACT

A time-to-digital converter (TDC) includes a count logic and a digital core. The count logic generates a first sequence of counts representing a first sequence of edges of a first periodic signal, and a second sequence of counts representing a second sequence of edges of a second periodic signal. The digital core generates a sequence of outputs representing the phase differences between the first periodic signal and the second periodic signal from the first sequence of counts and the second sequence of counts. Each output is generated from a pair of successive edges of the first direction of one of the periodic signals and an individual one of the other periodic signal occurring between the pair, and the output is set equal to the minimum of difference of the individual one with the first value of the pair and the individual one with the second value of the pair.

20 Claims, 15 Drawing Sheets

(56) References Cited

U.S. PATENT DOCUMENTS

| | | | | |
|---|---|---|---|---|
| 11,387,834 | B1* | 7/2022 | Kumar | H03L 7/1803 |
| 2004/0161068 | A1* | 8/2004 | Zerbe | H04L 7/033 |
| | | | | 375/355 |
| 2008/0069292 | A1 | 3/2008 | Straayer et al. | |
| 2009/0296532 | A1* | 12/2009 | Hsieh | G04F 10/005 |
| | | | | 368/120 |
| 2010/0134083 | A1* | 6/2010 | Trescases | H03M 1/1014 |
| | | | | 323/283 |
| 2020/0028662 | A1* | 1/2020 | Brown | H03L 7/18 |
| 2022/0026856 | A1* | 1/2022 | Lee | H03L 7/085 |

OTHER PUBLICATIONS

"Variable Modulus Counter" http://www.elektronikjk.pl/elementy_czynne/IC/9305.pdf, downloaded circa Jan. 10, 2022, 04 Pages.

Wu Gao et al., "Integrated High-Resolution Multi-Channel Time-to-Digital Converters (TDCs) for PET Imaging", http://citeseerxist.psu.edu/viewdoc/download?doi=10.1.1.688.658&rep=rep1&type=pdf, Jan. 8, 2011, 23 Pages.

Kuo-Hsing Cheng et al., "A time-to-digital converter using multi-phase-sampling and time amplifier for all digital phase-locked loop," 13th IEEE Symposium on Design and Diagnostics of Electronic Circuits and Systems, Date of Conference: Apr. 14-16, 2010, 05 Pages.

Scott Tancock et al., "A Review of New Time-to-Digital Conversion Techniques," in IEEE Transactions on Instrumentation and Measurement, vol. 68, No. 10, pp. 3406-3417, Oct. 2019.

Kyu-Dong Hwang et al., "An area efficient asynchronous gated ring oscillator TDC with minimum GRO stages," Proceedings of 2010 IEEE International Symposium on Circuits and Systems, Date of Conference: May 30, 2010-Jun. 2, 2010, pp. 3973-3976.

"TDC7201 Time-to-Digital Converter for Time-of-Flight Applications in LIDAR, Range Finders, and ADAS" SNAS686—May 2016 DOI: https://www.ti.com/lit/ds/symlink/tdc7201.pdf?ts=1641356653664&ref_url=https%253A%252F%252Fwww.google.com%252F, May 2016, 50 Pages.

"Time-to-Digital Converter with Analog Front-End" MAX35101 DOI: https://datasheets.maximintegrated.com/en/ds/MAX35101.pdf, Downloaded circa Jan. 10, 2022, 66 Pages.

J. Christiansen, "High Performance Time to Digital Converter" Version 2.2, https://cds.cern.ch/record/1067476/files/cer-002723234.pdf, Mar. 2004, 102 Pages.

"MTD135 8-Channel, Multi-hit Time-to-Digital Converter", https://teledynelecroy.com/lrs/dsheets/mtd.htm, downloaded circa Jan. 7, 2022, 10 Pages.

"TDC-GP1 General Purpose TDC" General Purpose TDC, Feb. 12, 2001, acam mess electronic, https://www.pmt-fl.com/uploads/2017/09/precision-measurement-db-gp1-en-1019306.pdf, Feb. 12, 2001, 61 Pages.

QuTag, https://www.qutools.com/wp-content/uploads/2019/02/quTAG_Datasheet.pdf, Downloaded circa Jan. 7, 2022, 04 Pages.

* cited by examiner

TIME-TO-DIGITAL CONVERTER (TDC) MEASURING PHASE DIFFERENCE BETWEEN PERIODIC INPUTS

PRIORITY CLAIM

The instant patent application is related to and claims priority from the co-pending India provisional patent application entitled, "Time-to-Digital Converter (TDC) Architecture for Measuring Phase Differences Among Multiple Clocks", Serial No.: 202141044473, Filed: 30 Sep. 2021, which is incorporated in its entirety herewith to the extent not inconsistent with the description herein.

RELATED APPLICATIONS

The instant application is related to co-pending US Patent Application No: UNASSIGNED, Entitled, "Counter Design for a Time-To-Digital Converter (TDC)", inventors Debasish Behera, et al, Filed: On even date herewith; Ser. No. 17/662,662, which is incorporated in its entirety herewith.

The instant application is related to co-pending US Patent Application No: UNASSIGNED, Entitled, "Time-to-digital Converter (TDC) Measuring Phase difference between Periodic Inputs with Jitter", inventors Debasish Behera, et al, Filed: On even date herewith; Ser. No. 17/662,669, which is incorporated in its entirety herewith.

BACKGROUND

Technical Field

Embodiments of the present disclosure relate generally to time-to-digital converters (TDCs), and more specifically to TDCs measuring phase difference between periodic inputs.

Related Art

TDCs are generally used to measure a time interval between a pair of events. The measurement is often quantified as a corresponding digital value. The events are typically voltage or logic-level changes of a corresponding pair of signals. TDCs find applications in electronic devices such as phase locked loops (PLL), timing cards, ToF (time-of-flight) measuring devices such as in radiation detectors, diagnostic equipment, etc.

TDCs often receive periodic inputs and are required to generate successive digital values representing the phase difference at corresponding time instances. Each digital value represents the time difference between corresponding edges (of the same direction) of the two periodic inputs. Examples of periodic signals include clocks, etc.

Aspects of the present disclosure are directed to such TDCs.

BRIEF DESCRIPTION OF THE VIEWS OF DRAWINGS

Example embodiments of the present disclosure will be described with reference to the accompanying drawings briefly described below.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

A time-to-digital converter (TDC) provided according to an aspect of the present disclosure includes a count logic and a digital core. The count logic generates a first sequence of counts and a second sequence of counts respectively for a first periodic signal and a second periodic signal received as input signals. The first sequence of counts represents respective time instances on a time scale at which a first sequence of edges with a first direction of the first periodic signal occur, and the second sequence of counts represents respective time instances on the same time scale at which a second sequence of edges with the first direction of the second periodic signal occur.

The digital core generates a sequence of outputs representing the phase differences between the first periodic signal and the second periodic signal from the first sequence of counts and the second sequence of counts. Each output of the sequence of outputs is generated from a pair of successive edges of the first direction of one of the periodic signals and an individual one of the other periodic signal occurring between the pair, and the output is set equal to the minimum of difference of the individual one with the first value of the pair and the individual one with the second value of the pair.

By setting each output to such a minimum difference, the TDC may be particularly suited for environments which seek to obtain a steady state quickly.

According to an aspect, the TDC is designed to operate with the first periodic signal and the second periodic signal in durations when the signals have the same frequency, in addition to durations when the first periodic signal has a frequency of N times the frequency of the second periodic signal, where N is greater than or equal to 2 (integer relationship).

When such integer relationship is present, the pair of successive edges noted above are of the second periodic signal and the individual one is of the first periodic signal. Multiple clock cycles of the first periodic signal are present between the pair of successive edges, wherein the individual one is the earliest or last edge of the multiple clock cycles which is closer in time to either of the pair of successive edges.

Several aspects of the present disclosure are described below with reference to examples for illustration. However, one skilled in the relevant art will recognize that the disclosure can be practiced without one or more of the specific details or with other methods, components, materials and so forth. In other instances, well known structures, materials, or operations are not shown in detail to avoid obscuring the features of the disclosure. Furthermore, the features/aspects described can be practiced in various combinations, though only some of the combinations are described herein for conciseness.

2. Example Device

Figure 1A:
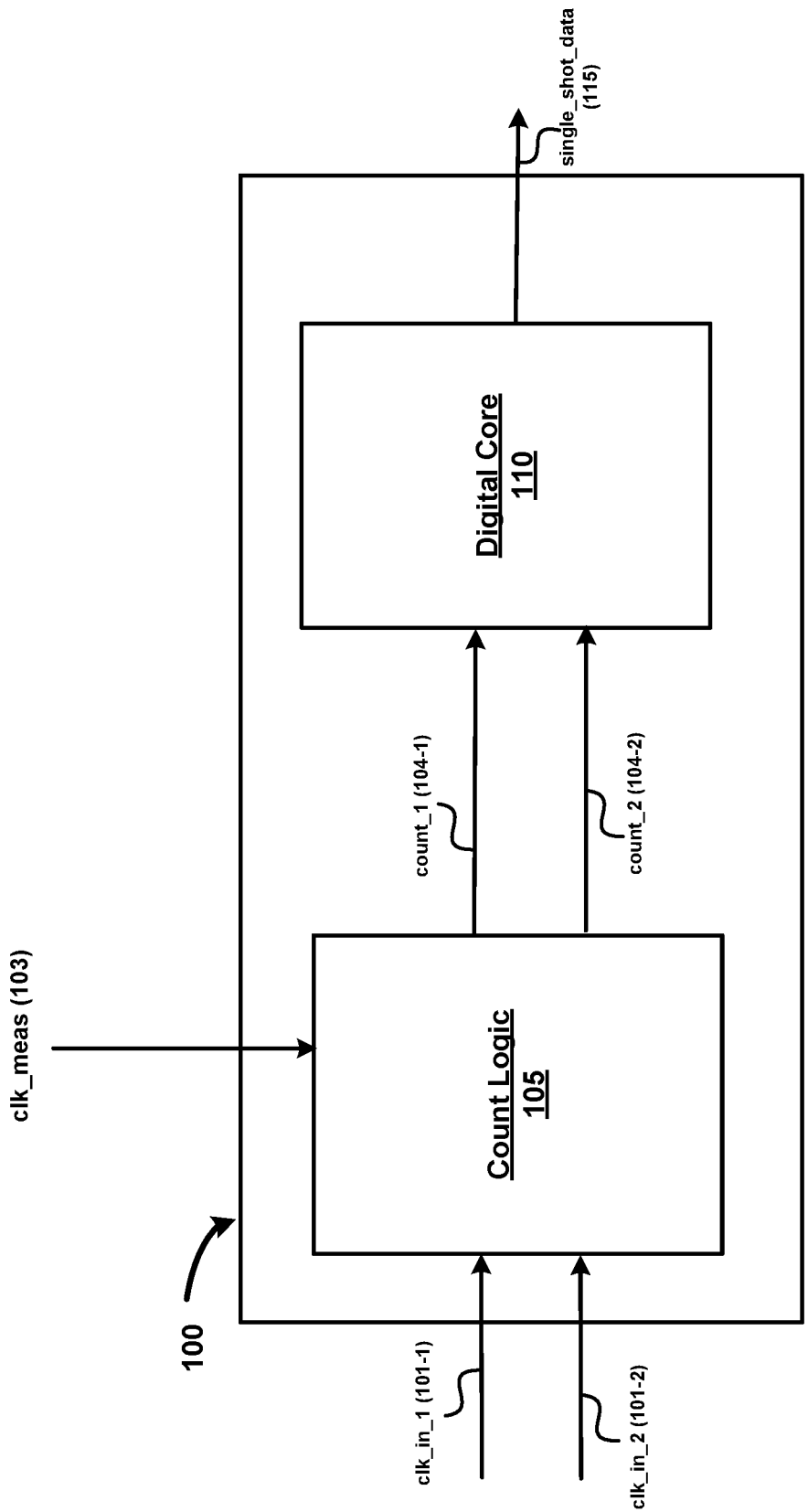
FIG. 1A is a block diagram of an example device in which several aspects of the present disclosure can be implemented.

FIG. 1A is a block diagram of a time-to-digital converter (TDC) implemented according to several aspects of the present disclosure, in an embodiment. TDC 100 is shown containing count logic 105 and digital core 110. TDC 100 is shown connected to receive input clocks clk_in_1 (101-1) and clk_in_2 (101-2), and a measurement clock clk_meas (103). Input clocks clk_in_1 (101-1) and clk_in_2 (101-2) represent the periodic inputs for which a phase difference is sought to be measured (determined) using TDC 100. 'Phase difference' refers to the difference in phase angle between two periodic signals. The periodic signals may have the same frequency or have frequencies that are integer multiples greater than 1. The output digital values representing the phase differences are provided in sequence on output path 115 (single_shot_data).

Count logic 105 internally contains counters for each of input clocks clk_in_1 (101-1) and clk_in_2 (101-2). Count logic 105 is connected to receive input clocks clk_in_1 (101-1) and clk_in_2 (101-2). Clk_meas (103) represents a measurement clock applied to the counters in count logic 105. In an embodiment, each of the counters is designed to increment by one count at each cycle (e.g., at each rising edge) of clk_meas (103). However, in alternative embodiments, other conventions for counting, such as decrementing the counters by 1 or some other fixed value for each clock cycle of clk_meas (103), may be employed, as will be apparent to a skilled practitioner. The frequency of clk_meas (103) at least partially or substantially determines the resolution with which the time difference between two events (such as, for example, rising edges of the input clocks) can be generated.

Count logic 105 is shown as generating count_1 (104-1) and count_2 (104-2) respectively for input clocks clk_in_1 (101-1) and clk_in_2 (101-2). Each sequence of counts in count_1 (104-1) and count_2 (104-2) represents respective time instances on a same time scale at which edges of a pre-specified direction (rising or falling) of corresponding input clocks occur. The term 'same time scale' implies that each count represents a respective relative time duration from a common start time. For example, counters for each input clock start counting (e.g., from zero) at the same time (e.g., upon reset) and with identical frequency. Count logic 105 can be implemented in a known way. In an embodiment of the present disclosure, counts generated by counters in count logic 105 are 36-bits wide, and the time resolution of the counters is 62.5 pico-seconds (ps).

In an embodiment, count logic 105 is implemented as described in U.S. application Ser. No. UNASSIGNED, filed: on even date herewith, entitled "Counter Design for a Time-To-Digital Converter (TDC)", and assigned to the assignee of the present application, the contents of which are incorporated herein by reference in its entirety.

Digital core 110 is connected to receive count_1 (104-1) and count_2 (104-2), and generates output digital values representing the phase difference between input clock signals (101-1 and 101-2). The output digital values are provided in sequence on path 115.

Several features of the present disclosure would be better understood and appreciated when the manner in which a TDC measures phase difference for a pair of periodic inputs is illustrated. Accordingly, the manner in which a TDC measures phase difference is briefly described next with respect to FIG. 1B.

3. Measuring Phase Difference Between a Pair of Periodic Inputs

Figure 1B:
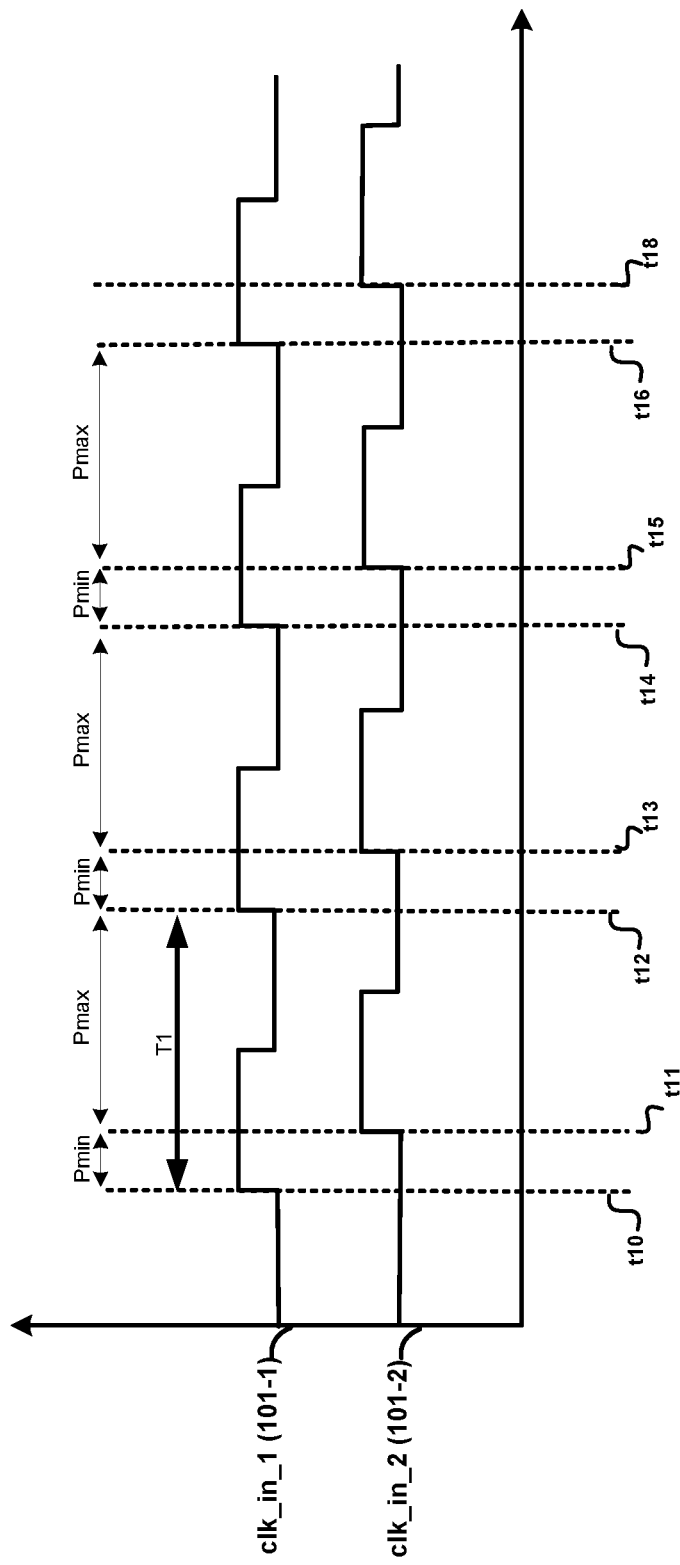
FIG. 1B is a timing diagram illustrating the phase difference for a pair of input clocks in an embodiment.

FIG. 1B is a timing diagram illustrating the manner in which a TDC measures phase difference between a pair of periodic inputs of the same frequency but unknown phase difference in an embodiment. In FIG. 1B, the waveform depicting the phase difference is not to scale, and is provided merely to illustrate phase difference. In FIG. 1B, waveforms 101-1 and 101-2 respectively represent the input clocks (clk_in_1 and clk_in_2) for which phase difference is sought to be measured.

The rising edges of clk_in_1 (101-1) are shown to be occurring at time instants t10, t12, t14 and t16, while the rising edges of clk_in_2 (101-2) are shown to be occurring at time instants t11, t13, t15 and t18. The time-period of clk_in_1 (101-1) is depicted as T1 (time interval between two consecutive rising edges).

Since digital core 110 receives a sequence of counts corresponding to the rising edges of clk_in_1 (101-1) and clk_in_2 (101-2), digital core 110 would generate two possible differences between the clock edges of clk_in_1 and clk_in_2, namely Pmin (representing for example, the smaller time interval t10-t11) and Pmax (representing, for example, the larger time interval t11-t12).

According to an aspect of the present disclosure, Pmin (rather than Pmax), i.e., the smaller of the two differences, is provided as the (correct) phase difference. By providing Pmin as the phase difference, circuits (e.g., a PLL) that rely on processing of the phase difference may attain a steady state sooner, in addition to reducing jittery output.

According to another aspect, digital core 110 computes both Pmin and Pmax, and then identifies the smaller of Pmin and Pmax as the phase difference between a pair of input clocks. Such an approach avoids the need for the knowledge of the exact frequency of the input clocks, which can otherwise be used to determine Pmin from Pmax alone (or Pmax from Pmin alone).

Although the timing diagram of FIG. 1B illustrates the need for identifying minimum time difference between edges of a pair of periodic inputs (input clocks) having the same frequency, it would be apparent to a skilled practitioner that the same problem would present itself for a pair of input clocks whose frequencies are integer-related multiples greater than 1. In such case, there would a set of more than 2 possible time differences between a pair of successive edges (of a same direction, i.e., rising or falling) of the slower of the two clocks, out of which the smallest difference needs to be identified as the (correct) phase difference. Aspects of the present disclosure are applicable to such pair of inputs as well.

Further, although the timing diagram of FIG. 1B illustrates a scenario where clk_in_2 (101-2) is shown to be lagging in phase to clk_in_1 (101-1), it would be apparent to a skilled practitioner that clk_in_2 (101-2) may be leading in phase to clk_in_1 (101-1), and the same problem would present itself in such scenarios as well.

TDC 100 is noted above as operating on only a pair of periodic inputs. However, a TDC can be implemented to operate simultaneously on more than one pair of periodic inputs. In such cases, multiple phase differences (between a respective pair of input clocks) may be measured in parallel and provided as corresponding outputs by the TDC. Accordingly, the implementation details of a digital core contained in such a TDC in an embodiment of the present disclosure are briefly provided next.

4. Digital Core of a TDC Operating on Multiple Input Clocks

Figure 1C:
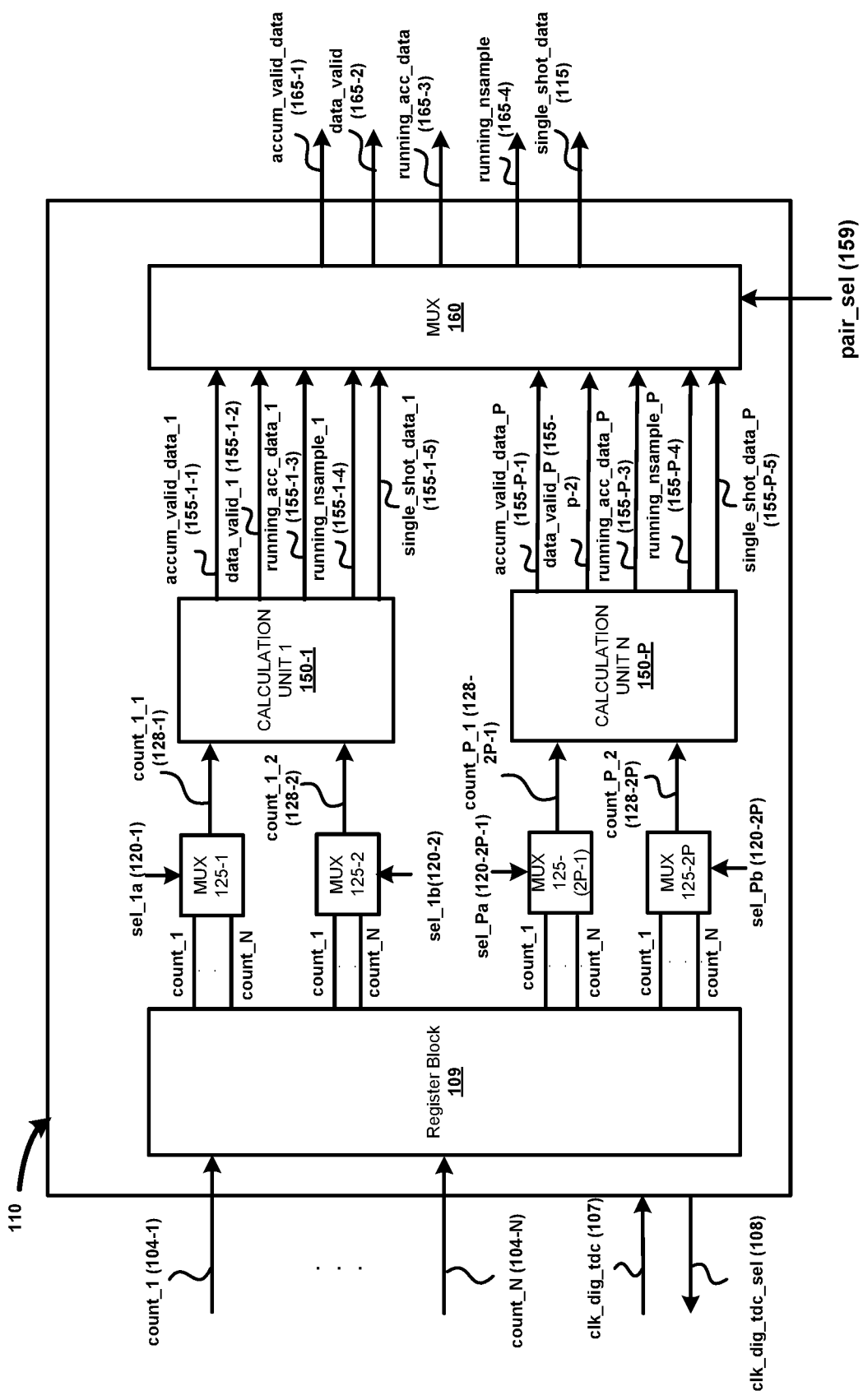
FIG. 1C is a block diagram of a digital core contained in a TDC that operates simultaneously on more than one pair of periodic inputs, implemented in an embodiment of the present disclosure.

FIG. 1C is a block diagram of a digital core of a TDC implemented according to several aspects of the present disclosure, in an embodiment. Digital core 110 is shown connected to receive counts count_1 (104-1) through count_N (104-N) (N equals 10 in an embodiment), clk_dig_tdc (107) and pair_sel (159).

As will be clear from the description, the phase difference may be measured between any one or multiple pairs of input clock signals. The output digital values are provided in sequence on combination of output paths 165-1 (accum_valid_data) and 165-3 (running_acc_data) in case of accumulation modes, and on path 115 (single_shot_data) in case of single-shot modes, as described below in further detail.

In an embodiment of the present disclosure, each count values (counts) 104-1 through 104-N is 36-bits wide, and the respective blocks in digital core 110 are designed with internal paths and blocks (e.g., registers) having widths that can handle the bit-width of the counts.

Clk_dig_tdc (107) is generated internal to count logic 105, and is provided as a master clock to the corresponding components of digital core 110, as also described below. In an embodiment of the present disclosure, the frequency of clk_dig_tdc (107) is greater than the maximum frequency allowed for input clocks clk_in_1 (101-1) through clk_in_N (101-N) by a factor of at least two. All sequential blocks of digital core 110 are designed to operate synchronously based on a single master clock clk_dig_tdc (107). Clk_dig_tdc_sel (108) is generated by digital core 110, and is received by count logic 105 (not shown). Clk_dig_tdc_sel (108) is used to select the frequency of clk_dig_tdc (107) for the digital core.

Referring to FIG. 1C, digital core 110 is shown containing register block 109, multiplexers (MUX) 125-1 through 125-2P, calculation units 150-1 through 150-P and an output MUX 160. With N input clocks, up to (N*(N−1)/2) pairwise combinations of the input clocks are possible. Thus, P can be an integer having a range of integer values from 2 to (N*(N−1)/2). Thus, for example, when N equals 10, TDC 100 can measure between 2 and 45 phase differences in parallel, with the corresponding number of calculation units 150. In an embodiment, P equals 10 and the specific desirable pairs are specified by appropriate multiplexer select inputs, as described below.

The specific blocks and interconnections of FIG. 1C are shown merely by way of example. More or fewer blocks can be used in other embodiments of the present disclosure. Input counts (count values), multiplexers, select signals and calculation units are collectively or individually referred to by 104, 125, 120 and 150 respectively, as will be clear from the context.

Register block 109 receives and stores count_1 (104-1) through count_N (104-N) in respective internal registers, and generates P copies of count_1 (104-1) through count_N (104-N) with the timing of storing controlled by clk_dig_tdc 107. Register block 109 forwards the P copies of count_1 (104-1) through count_N (104-N) according to clk_dig_tdc (107) as respective outputs.

Each of MUX 125-1 through 125-2P is an N:1 multiplexer, receives input counts count_1 (104-1) through count_N (104-N), and a respective select signal sel_1a (120-1), sel_1b (120-2) through sel Pa (120-2P-1), sel_Pb (120-2P). Thus, each of MUX 125 forwards one of the N counts as respective outputs (MUX outputs/selected counts) on path 128-1 through 128-2P based on the logic value of select signal 120. Select signals sel_1a (120-1) through sel_Pb (120-2P) may be set by a user (via corresponding means not shown) to indicate a pair of count-1 to count-N to be used as input clocks to respective calculation unit 150.

For example, MUX 125-1 may forward one of count_1 through count_N on path 128-1 to calculation unit 1 (150-1) based on logic value of select signal sel_1a (120-1), and MUX 125-2 may forward one of count_1 through count_N on path 128-2 to calculation unit 1 (150-1) based on logic value of select signal sel_1b (120-2). Thus, a corresponding pair of counts may be provided as inputs to each calculation unit 150 for determining the phase difference between the corresponding inputs.

Each calculation unit 150 receives a corresponding pair of counts as inputs and generates respective outputs based on mode of operation of TDC 100. Thus, calculation unit 150-1 is shown to be generating outputs accum_valid_data_1 (155-1-1), data_valid_1 (155-1-2), running_acc_data_1 (155-1-3), running_nsample_1 (155-1-4) and single_shot_data_1 (155-1-5), while calculation unit 150-P is shown to be generating outputs accum_valid_data_P (155-1-P), data_valid_P (155-P-2), running_acc_data_P (155-P-3), running_nsample_P (155-P-4) and single_shot_data_P (155-P-5). Each of single_shot_data_1 through single_shot_data_P provides a corresponding sequence of phase differences between the corresponding pairs of input clocks to the calculation units, and corresponds to single_shot_data (115) in the case of only a pair of input clocks as shown in FIG. 1A. Although not shown in FIG. 1C, each calculation unit 150-1 through 150-P receives clk_dig_tdc (107) for its operation. The other outputs of each calculation unit will be clear once the various modes of operation of TDC 100 are described below.

MUX 160 receives outputs from calculation units 150 and a select signal pair_sel (159). Pair_sel (159) may be set by a user (via corresponding means not shown) to indicate one of calculation units 150-1 through 150-P whose outputs may be provided as outputs of TDC 100. Outputs accum_valid_data (155-1), data_valid (155-2), running_acc_data (155-3), running_nsample (155-4) and single_shot_data (115) thus respectively correspond to the outputs of calculation unit 150 that is selected based on pair_sel (159). Pair_sel (159) can cycle through P values so as to enable the outputs of each calculation unit to be provided as outputs of TDC 100 substantially in parallel. The various modes of operation noted above are now described.

In an embodiment, TDC 100 is designed to operate in the following modes:

1. Accumulator mode, with input clocks clk_in_1 (101-1) through clk_in_N (101-N) having the same frequency.
2. Accumulator mode, with frequency of input clocks clk_in_1 (101-1) through clk_in_N (101-N) being integer-related.
3. Continuous single-shot mode
4. One-time single-shot mode In modes (1) and (2), calculation unit 150 operates on periodic inputs (such as clk_in_1 (101-1) through clk_in_N (101-N)) and receives (from user via corresponding means not shown) a pre-determined value indicating the number of phase difference samples to be accumulated. In these two modes, TDC 100 generates outputs on paths 155-1 (accum_valid_data), 155-2 (data_valid), 155-3 (running_acc_data) and 155-4 (running_nsample). At the end of sampling every pre-determined number of samples, calculation unit 150 asserts data_valid (155-2) and provides the accumulated phase difference value on path 155-1 (accum_valid_data). At the end of accumulating each phase difference sample, calculation unit 150 provides the phase difference value accumulated thus far on path 155-3 (running_acc_data). Running_nsample (155-4) indicates the number of samples accumulated in running_acc_data (155-3). An average of the accumulated values (total accumulated value divided by the number of samples accumulated) may be determined by a component external to TDC 100.

In mode (3), calculation unit 150 operates on periodic inputs (such as clk_in_1 (101-1) through clk_in_N (101-N)) and generates phase difference between each pair of the periodic inputs (without accumulation of phase difference samples as in mode 1 and 2), and provides the sequence of phase differences on path 115 (single_shot_data).

In mode (4), calculation unit 150 operates on pulse inputs, generates a one-time phase difference between the pulses, and provides the phase difference on path 115 (single_shot_data).

A calculation unit in FIG. 1C (e.g., 150-1) would be functionally equivalent to digital core 110 of the two-inputs-only scenario of FIG. 1A.

The manner in which digital core 110 of FIG. 1A determines the phase difference between input clocks 101-1 and 101-2 is described next in detail.

5. Digital Core

Figure 2:
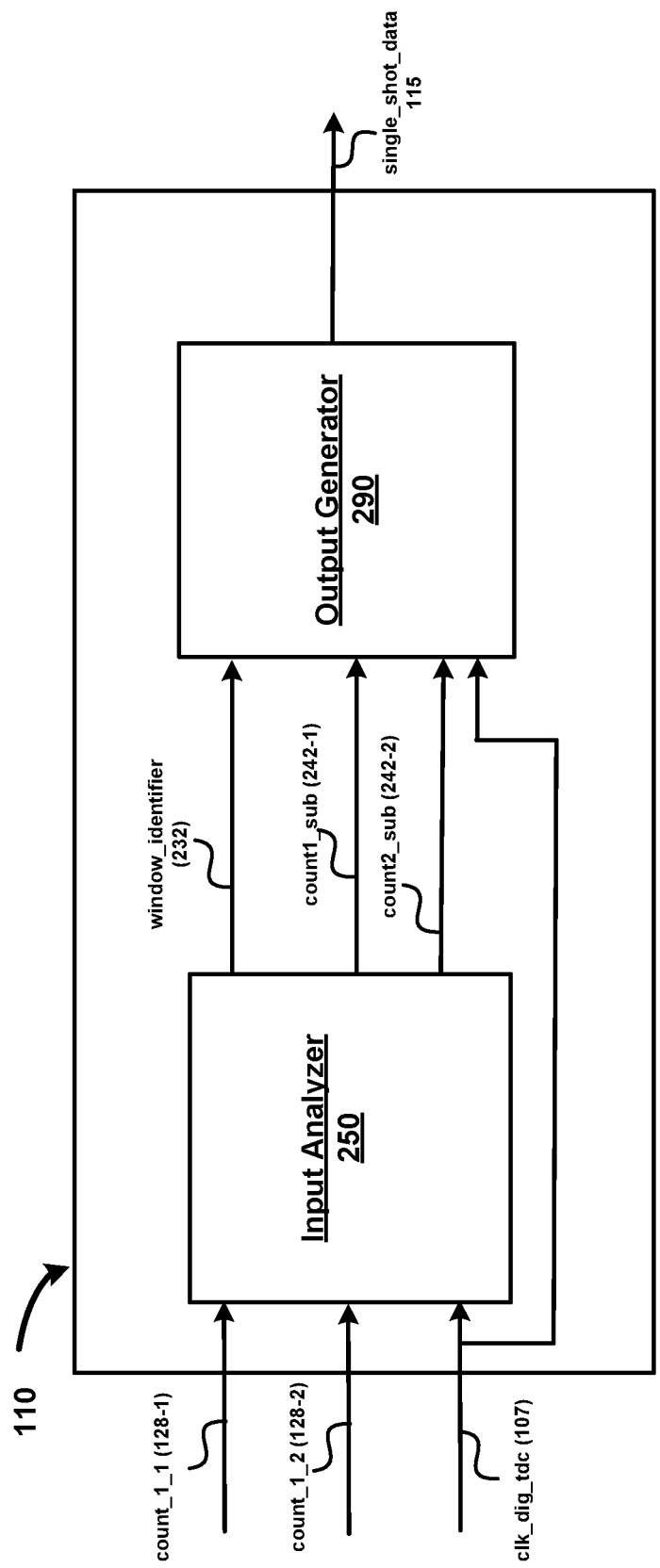
FIG. 2 is a block diagram of a calculation unit implemented in an embodiment of the present disclosure.

FIG. 2 is a block diagram illustrating the implementation details of digital core 110 in an embodiment of the present disclosure. Digital core 110 is shown containing input analyzer block 250 and output generator block 290.

Input analyzer block 250 is shown as receiving inputs count_1_1 on path 128-1, count_1_2 on path 128-2 and clk_dig_tdc on path 107. Input analyzer block 250 generates signals window_identifier on path 232, count1_sub on path 242-1 and count2_sub on path 242-2. Input analyzer block 250 receives count_1_1 (128-1) and count_1_2 (128-2) at every rising edge of the corresponding input clock. Input analyzer block 250 may store count_1_1 (128-1) and count_1_2 (128-2) values, and additionally perform operations such as handling rollover of counters generating count_1_1 (128-1) and count_1_2 (128-2), as is described below in detail. In the absence of such additional operations, count1_sub (128-1) and count2_sub (128-2) are functionally equivalent to count_1_1 (128-1) and count_1_2 (128-2) respectively.

Input analyzer 250, among other operations, operates to determine the boundaries of windows (respective time instances) corresponding to (or defined by) a pair of successive edges of either one of the two input clocks clk_in_1 (101-1) and clk_in_2 (101-2) when both clocks have the same frequency, and of the slower clock when the clocks have frequencies that are integer multiples greater than 1. Input analyzer 250 indicates the boundaries (the left and right edges) of a window using signal window_identifier (232), as will be described in detail below.

Although the description is continued with respect to rising edges of input clocks, aspects of the present disclosure are equally applicable to falling edges of input clocks, as will be apparent to a skilled practitioner by reading the disclosure herein.

Output generator block 290 is shown as receiving window_identifier on path 232, count1_sub on path 242-1, count2_sub on path 242-2 and clk_dig_tdc on path 107. Output generator block 290 generates a sequence of phase differences on path 115 (single_shot_data) upon the end of each window defined by window_identifer (232). The phase differences in the sequence may all be substantially equal unless the phase difference between the two input clocks were to change.

The details of the operations performed by input analyzer block 250 and Output generator block 290 of digital core 110 (or calculation unit 150 in general) in determining the phase difference between a pair of input clocks are described in detail next.

6. Input Analyzer Block

Figure 3A:
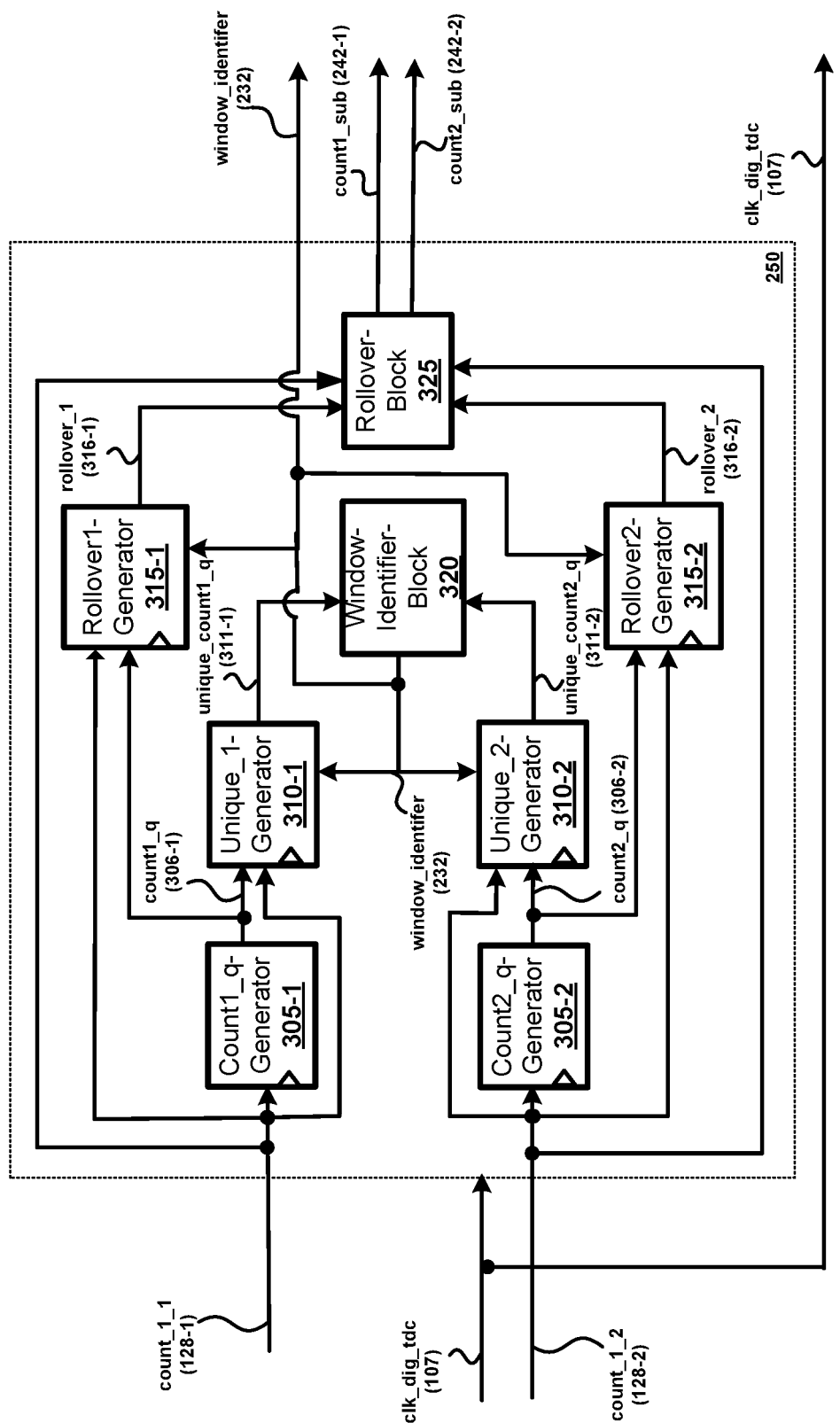
FIG. 3A is a block diagram of an input analyzer block implemented in an embodiment of the present disclosure.

FIG. 3A is a block diagram illustrating the implementation details of an input analyzer block in an embodiment of the present disclosure. Input analyzer block 250 is shown containing count_1_q-generator 305-1, count_2_q-generator 305-2, unique_1-generator 310-1, unique_2-generator 310-2, rollover1-generator 315-1, rollover2-generator 315-2, window-identifier-block 320 and rollover block 325. The specific blocks and interconnections of FIG. 3A are shown merely by way of example. More or fewer blocks can be used in other embodiments of the present disclosure. In an embodiment of the present disclosure, blocks 305-1, 305-2, 310-1, 310-2, 315-1 and 315-2 are implemented using sequential logic, while blocks 320 and rollover block 325 are implemented using combinatorial logic. However, the blocks can be implemented differently as will be apparent to a skilled practitioner by reading the disclosure herein. Sequential blocks of input analyzer block 250 are clocked by clk_dig_tdc (107).

As noted above, the frequency of clk_dig_tdc (107) is greater than the frequency of clk_in_1 (101-1) and clk_in_2 (101-2), and the values of count_1_1 (128-1) and count_1_2 (128-2) are received at every rising edge of respective clocks. Thus, the values of count_1_1 (128-1) and count_1_2 (128-2) can remain unchanged for two or more cycles of clk_dig_tdc (107). Accordingly, a change in respective values of count_1_1 (128-1) and count_1_2 (128-2) may be inspected for determining phase difference between clk_in_1 (101-1) and clk_in_2 (101-2). Blocks count_1_q-generator 305-1, count_2_q-generator 305-2, unique_1-generator 310-1, unique_2-generator 310-2 and window-identifier-block 320 operate to provide such functionality.

Count_1_q-generator 305-1 receives count_1_1 on path 128-1 and generates count1_q on path 306-1. In an embodiment, count1_q generator is implemented as a positive edge triggered flip-flop. Count1_q generator 305-1 is clocked by clk_dig_tdc (107). Count_1_q (306-1) represents a time-delayed version of count_1_1 (128-1). Accordingly, signal count_1_1 (128-1) is delayed by one clock cycle of clk_dig_tdc (107) before being output on path 306-1.

Count_2_q-generator 305-2 receives count_1_2 on path 128-2 and generates count2_q on path 306-2. In an embodiment, count2_q generator is implemented as a positive edge triggered flip-flop. Count2_q generator 305-2 is clocked by clk_dig_tdc (107). Count_2_q (306-2) represents a time-delayed version of count_1_2 (128-2). Accordingly, signal count_1_2 (128-2) is delayed by one clock cycle of clk_dig_tdc (107) before being output on path 306-2.

Unique_1-generator 310-1 receives count_1_1 (128-1), count1_q (306-1) and window_identifier (232), and generates unique_count1_q on path 311-1. As may be observed from FIG. 3A, the operations of unique_1-generator 310-1 and window-identifier-block 320 (described below) depend on the outputs of each other. In general, unique_1-generator 310-1 is a binary signal that indicates whether a new count is available at the boundary of a window identified by window-identifier-block 320. In an embodiment of the present disclosure, unique_1-generator 310-1 is implemented as a sequential block, clocked by clk_dig_tdc (107), and implements the following logic:

Unique_1-generator 310-1 generates a logic LOW on path 311-1 when count_1_1 (128-1) is equal to count1_q (306-1) and window_identifier (232) is a logic HIGH, and a logic HIGH when count_1_1 (128-1) is not equal to count1_q (306-1). In other words, unique_1-generator 310-1 operates to determine that the count value of count_1_1 (128-1) has undergone a change (indicating the occurrence of a rising edge of clk_in_1, 101-1) from its value in a previous clock cycle of clk_dig_tdc (107), and also additionally takes into account the value of window_identifier (232).

Unique_2-generator 310-2 receives count_1_2 (128-2), count2_q (306-2) and window_identifier (232), and generates unique_count2_q on path 311-2. As may be observed from FIG. 3A, the operations of unique_2-generator 310-2 and window-identifier-block 320 (described below) depend on the outputs of each other. In general, unique_2-generator 310-2 is a binary signal that indicates whether a new count is available at the boundary of a window identified by window-identifier-block 320. In an embodiment of the present disclosure, unique_2-generator 310-2 is implemented as a sequential block, clocked by clk_dig_tdc (107), and implements the following logic:

Unique_2-generator 310-2 generates a logic LOW on path 311-2 when count_1_2 (128-2) is equal to count2_q (306-2) and window_identifier (232) is a logic HIGH, and a logic HIGH when count_1_2 (128-2) is not equal to count2_q (306-2). In other words, unique_2-generator 310-2 operates to determine that the count value of count_1_2 (128-2) has undergone a change (indicating the occurrence of a rising edge of clk_in_2, 101-2) from its value in a previous clock cycle of clk_dig_tdc (107), and additionally takes into account the value of window_identifier (232).

Digital core 110 receives a continuous stream of counts representing corresponding edges of input clocks (clk_in_1, 101-1 and clk_in_2, 101-2). Digital core 110 generates each output of the sequence of outputs (noted above) from a pair of successive edges (of a same direction, rising/falling) of one input clock (e.g., clk_in_1, 101-1) and an individual one of the other input clock (e.g., clk_in_2, 101-2). Digital core 110, therefore, needs to identify a respective pair of successive edges for generating each output. Window-identifier-block 320, implemented in input analyzer block 250, performs such an operation.

Window-identifier-block 320 operates to identify the window boundaries noted above. That is, window-identifier-block 320 operates to identify time instants of occurrence of a pair of successive edges of the same direction (rising or falling) of the slower input clock when the frequencies of the two input clocks are integer multiples greater than one, or a pair of successive edges of the same direction (rising or falling) of either of the two input clocks when the frequencies of the two input clocks are equal. The duration between the time instants is referred to herein as a window. Each window may have a respective stream of differences that need to be examined in order to generate an output (representing the phase difference between input clocks, clk_in_1, 101-1 and clk_in_2, 101-2) upon the end of each window.

Window-identifier-block 320 receives unique_count1_q (311-1) and unique_count2_q (311-2), and generates signal window_identifier on path 232. Window-identifier-block 320 generates a logic HIGH on path 232 when both unique_count1_q (311-1) and unique_count2_q (311-2) are logic HIGH, and a logic LOW otherwise. As will become apparent in the description below, a pair of successive logic HIGHs represents the window boundaries noted above.

Rollover1-generator 315-1 receives count_1_1 (128-1), count1_q (306-1), window_identifier (232) and generates signal rollover_1 on path 316-1. In an embodiment of the present disclosure, rollover1-generator 315-1 is implemented as a sequential block, clocked by clk_dig_tdc (107). Rollover1-generator 315-1 generates a logic HIGH on path 316-1 when a count value of count_1_1 (128-1) has exceeded the full-scale value (rolled over) of the counter. As is well known in the relevant arts, a rollover is said to occur when the value of a counter reaches its full-scale value, and the counter starts counting from zero. For example, for a 10-bit counter, a rollover is said to occur when the value of count reaches 1024.

Rollover2-generator 315-2 receives count_1_2 (128-2), count2_q (306-2), window_identifier (232) and generates signal rollover_2 on path 316-2. In an embodiment of the present disclosure, rollover2-generator 315-2 is implemented as a sequential block, clocked by clk_dig_tdc (107). Rollover2-generator 315-2 generates a logic HIGH on path 316-2 when a count value of count_1_2 (128-2) has exceeded the full-scale value (rolled over) of the counter.

Rollover block 325 receives count_1_1 (128-1), count_1_2 (128-2), rollover_1 (316-1) and rollover_2 (316-2), and generates count1_sub (242-1) and count2_sub (242-2). In an embodiment of the present disclosure, rollover block 325 is implemented as a combinational block. Rollover block 325 operates to ensure that a respective correct value of input counts is forwarded to Output generator block 290 in case of a rollover of either input count. The details of rollover handling are described below in detail with respect to FIG. 7.

The implementation details of output generator block 290 in an embodiment of the present disclosure are provided next.

7. Output Generator Block

Figure 3B:
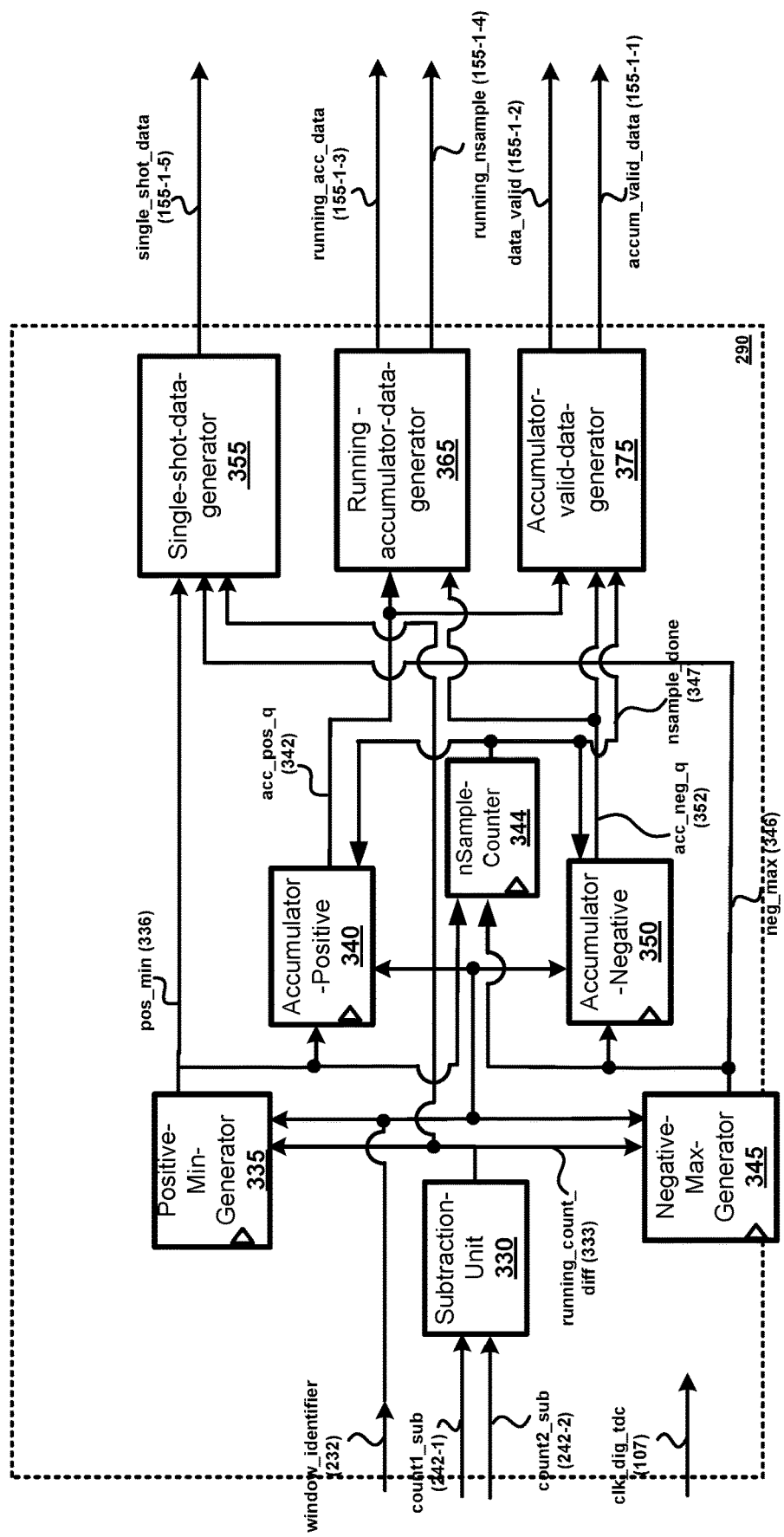
FIG. 3B is a block diagram of an output generator block implemented in an embodiment of the present disclosure.

FIG. 3B is a block diagram illustrating the implementation details of an output generator block in an embodiment of the present disclosure. Output generator block 290 is shown containing subtraction-unit 330, positive-min-generator 335, negative-max-generator 345, nSample-counter 344, accumulator-positive 340, accumulator-negative 350, single-shot-data-generator 355, running-accumulator-data-generator 365 and accumulator-valid-data-generator 375.

The specific blocks and interconnections of FIG. 3B are shown merely by way of example. More or fewer blocks can be used in other embodiments of the present disclosure. In an embodiment of the present disclosure, blocks 335, 345, 344, 340, 350, 355 and 375 are shown to be sequential while blocks 330 and 365 are shown to be combinational. Output single_shot_data (155-1-5) corresponds to single_shot_data 115 of FIG. 1A. The other outputs, namely, running_acc_data (155-1-3), running_nsample (155-1-4), data_valid (155-1-2) and accum_valid_data (155-1-1) are additionally generated by blocks 365 and 375, which are additionally implemented in calculation units 150 to enable operation in modes 1 and 2, and as described below.

Output generator block 290 receives signals window_identifier (232), count1_sub (242-1) and count2_sub (242-2). In an embodiment, signals window_identifier (232), count1_sub (242-1) and count2_sub (242-2) are buffered in a pipeline stage (not shown) that is one-sample deep to enable digital core 110 to meet circuit timing requirements. In an embodiment, the pipeline delay stage is implemented using registers, and the signals are delayed/buffered by one clock cycle of clk_dig_tdc (107).

Subtraction-unit 330 receives count1_sub on path 242-1 and count2_sub on path 242-2. Subtraction-unit 330 generates running_count_diff on path 333. In an embodiment of the present disclosure, subtraction-unit 330 is implemented as a signed subtraction block. Thus, subtraction-unit 330 generates a signed difference between count1_sub (242-1) and count2_sub (242-2). Running_count_diff (333) represents the stream of time differences between edges or edge-pairs of input clocks, clk_in_1 (101-1) and clk_in_2 (101-2) within a window.

Positive-min-generator 335 operates to determine the smallest positive value among/between a set of difference values (running_count_diff (333)) generated by subtraction-unit 330 in each window identified by window-identifier-block 320, i.e., between a pair of successive positive (rising) edges of the slower of the two input clocks. Positive-min-generator 335 receives running_count_diff on path 333 and window_identifier on path 232, and generates pos_min on path 336. In an embodiment of the present disclosure, positive-min-generator 335 is implemented as a sequential block clocked by clk_dig_tdc (107), and operates according to the following logic:

If window_identifier signal (232) is a logic HIGH and running_count_diff (333) is zero or a positive value, then pos_min (336) is recorded as running_count_diff (333). Else, if window_identifier signal (232) is a logic HIGH and running_count_diff (333) is non-zero and a negative value, then pos_min (336) is recorded as full-scale positive value. In other word, if count_1_1 (128-1) and count_1_2 (128-2) consist of P bits each, then full-scale positive value is $+(2^P-1)$. Else, if running_count_diff (333) is a positive value and less than pos_min (336), then pos_min (336) is updated to running_count_diff (333). Thus, positive-min-generator 335 operates to determine the minimum positive value of running_count_diff (333) between two successive window_identifier (232) pulses.

Negative-max-generator 345 operates to determine the greatest negative value among/between a set of difference values (running_count_diff (333)) generated by subtraction-unit 330 in each window identified by window-identifier-block 320, i.e., between a pair of successive positive (rising) edges of the slower of the two input clocks. Negative-max-generator 345 receives running_count_diff on path 333 and window_identifier on path 232, and generates neg_max on path 346. In an embodiment of the present disclosure, negative-max-generator 345 is implemented as a sequential block clocked by clk_dig_tdc (107), and operates on the following logic:

If window_identifier signal (232) is a logic HIGH and running_count_diff (333) is zero or a negative value, then neg_max (346) is recorded as running_count_diff (333). Else, if window_identifier signal (232) is a logic HIGH and running_count_diff (333) is non-zero and a positive value, then neg_max (346) is recorded as full-scale negative value. In other word, if count_1_1 (128-1) and count_1_2 (128-2) consist of P bits each, then full-scale negative value is $-(2^{P-1})$. Else, if running_count_diff (333) is a negative value and greater than neg_max (346) value, then neg_max (346) is updated to running_count_diff (333). Thus, negative-max-generator 345 operates to determine the maximum negative value of running_count_diff (3330 between two window_identifier (232) pulses.

nSample-counter 344 receives pos_min (336) and neg_max (346), and generates signal nsample_done on path 347. In an embodiment, nSample-counter 344 increments a value of a counter upon the end of each window, and asserts nsample_done (347) when the counter value equals the pre-determined number of phase difference samples provided as user input.

Accumulator-positive 340 receives pos_min on path 336, window_identifier on path 232, nsample_done on path 347, and generates acc_pos_q on path 342. Accumulator-positive 340 accumulates (adds) the received pos_min (336) values.

Accumulator-negative 350 receives neg_max on path 346, window_identifier on path 232, nsample_done on path 347, and generates acc_neg_q on path 352. Accumulator-negative 350 accumulates (adds) received neg_max (346) values.

Acc_pos_q (342) and acc_neg_q (352) are examined by running-accumulator-data-generator 365 and accumulator-valid-data-generator 375 to determine outputs (running_acc_data, 155-1-3 and accum_valid_data, 155-1-1) in modes (1) and (2) noted above. Blocks 340, 350, 365 and 375 together comprise accumulation logic operable to generate corresponding outputs in accumulation modes of operation of TDC 100.

Single-shot-data-generator 355 receives pos_min on path 336, neg_max on path 346 and running_count_diff on path 333, and generates single_shot_data on path 155-1-5. In an embodiment of the present disclosure, single-shot-data-generator 355 is implemented as a sequential block, clocked by clk_dig_tdc (107). In continuous single-shot mode of operation, single-shot-data-generator 355 determines the absolute minimum value of pos_min (336) and neg_max (346) and provides it on path 155-1-5. In one-time single-shot mode, single-shot-data-generator 355 forwards running_count_diff (333) on path 155-1-5.

Running-accumulator-data-generator 365 receives acc_pos_q (342) and acc_neg_q (352), and generates running_acc_data on path 155-1-3 and running_nsample on path 155-1-4. Running-accumulator-data-generator 365 determines the absolute minimum value of acc_pos_q (342) and acc_neg_q (352) and provides it on path 155-1-3. Running_nsample (155-1-4) indicates the number of samples accumulated in running_acc_data (155-1-3).

Accumulator-valid-data-generator 375 receives acc_pos_q (342), acc_neg_q (352) and nsample_done (347), and generates signal data_valid on path 155-1-2 and accum_valid_data on path 155-1-1. At the end of sampling every pre-determined number of samples (indicated by nsample_done, 347), accumulator-valid-data-generator 375 asserts data_valid (155-1-2) and provides the absolute minimum of acc_pos_q (342) and acc_neg_q (352) on path 155-1-1.

The implementation details of unique 1 generator and unique_2 generator in an embodiment of the present disclosure are provided next.

8. Unique-Count Generator

Figure 4:
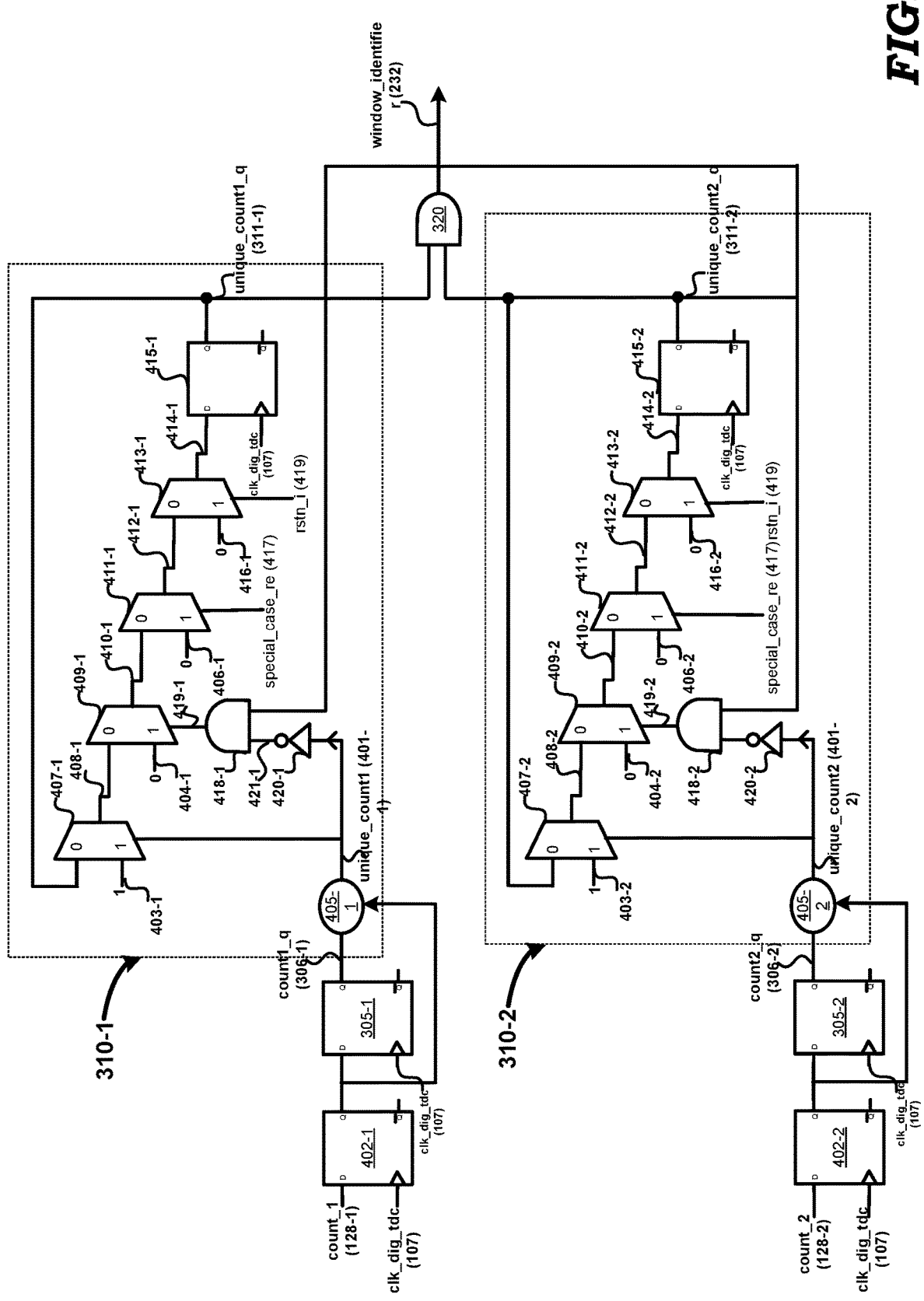
FIG. 4 is a block diagram illustrating the implementation details of a unique-count-generator and a window-identifier-block used in the generation of each phase difference value in an embodiment of the present disclosure.

FIG. 4 is a block diagram illustrating the implementation details of a unique-count generator in an embodiment of the present disclosure. FIG. 4 is shown containing count1_q generator 305-1, unique_1-generator 310-1, count2_q generator 305-2, unique_2-generator 310-2 and window-identifier-block 320. Unique_1-generator 310-1 in turn is shown containing logic_block 405-1, multiplexers (MUXes) 407-1, 409-1, 411-1, 413-1, flip-flop 415-2, inverter 420-1 and AND gate 418-1. Unique_2-generator 310-2 in turn is shown containing logic_block 405-2, multiplexers 407-2, 409-2, 411-2, 413-2, flip-flop 415-2, inverter 420-2 and AND gate 418-2. The specific blocks and interconnections of FIG. 4 are shown merely by way of example. More or fewer blocks can be used in other embodiments of the present disclosure.

Logic_block 405-1 receives count_1_1 (128-1) and count1_q (306-1) and generates unique_count1 (401-1). In an embodiment, logic_block 405-1 generates a logic HIGH on path 401-1 if count_1_1 (128-1) and count1_q (306-1) are unequal, and a logic LOW otherwise. Thus, logic_block 405-1 implements the logic: unique_count1=(count_1 !=count1_q).

MUX 407-1 receives a logic HIGH on path 403-1 and unique_count1_q (311-1), and forwards one of logic HIGH and unique_count1_q on path 408-1 as an output (MUX selected output) based on the logic value of select signal 401-1 (unique_count1). Accordingly, when unique_count1_q (401-1) is a logic HIGH, MUX 407-1 forwards logic HIGH (403-1) on path 408-1. When unique_count1_q (401-1) is a logic LOW, MUX 407-1 forwards unique_count1_q (311-1) on path 408-1.

MUX 409-1 receives a logic LOW on path 404-1 and output of MUX 407-1 on path 408-1, and forwards one of logic LOW and MUX output 408-1 on path 410-1 as an output (MUX selected output) based on the logic value of select signal 419-1. Accordingly, when the value on path 419-1 is a logic HIGH, MUX 407-1 forwards logic LOW (404-1) on path 410-1. When the value on path 419-1 is a logic LOW, MUX 409-1 forwards value 408-1 on path 410-1.

MUX 411-1 receives a logic LOW on path 406-1 and output of MUX 409-1 on path 410-1, and forwards one of logic LOW and MUX output 410-1 on path 412-1 as an output (MUX selected output) based on the logic value of select signal special_case_re (417). Signal special_case_re (417) is used to indicate jitter in input clocks that have zero phase difference in steady state. Accordingly, when special_case_re (417) is a logic HIGH, MUX 411-1 forwards logic LOW (406-1) on path 412-1. When special_case_re (417) is a logic LOW, MUX 411-1 forwards value 410-1 on path 412-1.

MUX 413-1 receives a logic LOW on path 416-1 and output of MUX 411-1 on path 412-1, and forwards one of logic LOW and MUX output 412-1 on path 414-1 as an output (MUX selected output) based on the logic value of select signal rstn_i (419). Rstn_i (419) represents chip reset or power-ON reset. Accordingly, when rstn_i (419) is a logic HIGH, MUX 413-1 forwards logic LOW (416-1) on path 414-1. When rstn_i (419) is a logic LOW, MUX 413-1 forwards value 412-1 on path 414-1.

Flip-flop 415-1 is clocked by clk_dig_tdc (107). Flip-flop 415-1 receives input signal on path 414-1 at its D input and generates output (Q), unique_count1_q, on path 311-1. In an embodiment, flip-flop 415-1 is implemented as a positive edge triggered flip-flop.

AND gate 418-2 receives output of inverter 420-1 on path 421-1 and signal window_identifier on path 232, and generates result of AND operation on path 419-1.

Window-identifier-block 320 receives unique_count1_q (311-1) and unique_count2_q (311-2), and generates signal window_identifier on path 232. Window-identifier-block 320 is implemented as an AND gate in an embodiment of the present disclosure. Thus, window-identifier-block 320 implements the logic: window_identifier=(unique_count1_q && unique_count2_q). In the illustrative embodiment, window_identifier (232) signal is de-asserted after one clock cycle of clk_dig_tdc (107). Accordingly, the pulse width of window_identifier (232) signal is equal to one clock cycle of clk_dig_tdc (107) and the frequency of window_identifier (232) signal is equal to the slower of the two selected input clock (clk_in_1, 101-1 and clk_in_2, 101-2) frequencies (in case of clocks whose frequencies are integer-related).

Components 405-1, 407-1, 409-1, 411-1 and 413-1 together implement the following logic:
if (window_identifier && !unique_count1)

unique_count1_$q$=0 else if (unique_count1)

unique_count1_$q$=1

The expression (window_identifier && !unique_count1) above contains the operators && and ! which respectively represent AND operator and NOT operator. Accordingly, expression (window_identifier && !unique_count1) would evaluate to a 1 when the value of window_identifier is a logic HIGH and the value of unique_count1 is a logic LOW, and to 0 otherwise.

Components 405-2, 420-2, 418-2, 407-2, 409-2, 411-2, 413-2 and 415-2 operate in a manner similar to components 405-1, 420-1, 418-1, 407-1, 409-1, 411-1, 413-1 and 415-1 respectively and the description is not repeated here in the interest of conciseness.

The manner in which unique-count generators and window-identifier-block operate to determine a window is illustrated next with example waveforms.

Figure 5:
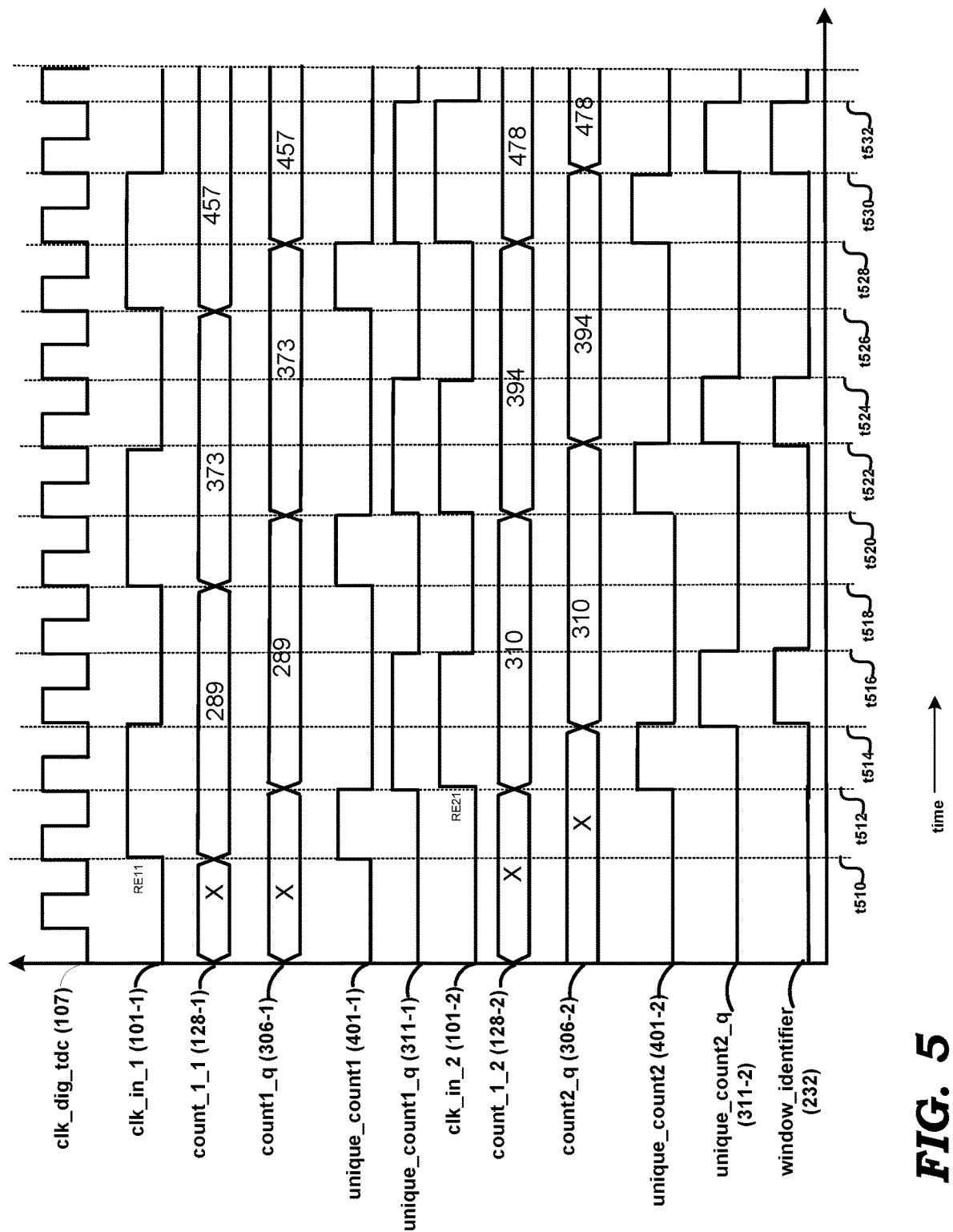
FIG. 5 is a timing diagram illustrating the manner in which a unique-count signal and a window_identifier signal are generated for a pair of input clocks having a same frequency, in an embodiment of the present disclosure.

9. Generation of Unique-Count Signal and Window_Identifier Signal for a Pair of Input Clocks Having the Same Frequency FIG. 5 is a timing diagram (not to scale) illustrating the manner in which unique count signals (410, 311) and signal window_identifier (232) are generated for a pair of input clocks having the same frequency in an embodiment of the present disclosure. FIG. 5 shows example waveforms of clk_dig_tdc (107), clk_in_1 (101-1), count_1_1 (128-1), count1_q (306-1), unique_count1 (401-1), unique_count1_q (311-1), clk_in_2 (101-2), count_1_2 (128-2), count2_q (306-2), unique_count2 (401-2), unique_count2_q (311-2) and window_identifier (232). In this illustrative embodiment, counts corresponding to input clocks (clk_in_1, 101-1 and clk_in_2, 101-2) are assumed to be 36 bits-wide. The specific count values and the phase difference between clk_in_1 and clk_in_2 shown in FIG. 5 are not to scale, and are meant merely to illustrate the manner in which the unique count values and window_identifier signal are generated. A value of 'X' in data waveforms (count_1_1 (128-1), count1_q (306-1), count_1_2 (128-2), count2_q (306-2), running_count_diff(333), pos_min (336), neg_max (346), acc_pos_q (342), acc_neg_q (352)) indicates a 'don't-care' value for the purpose of this illustration.

The value of '289' (count_1_1, 128-1) received at t510 corresponds to the digital representation of the time of occurrence of rising edge (RE11) of clk_in_1 (101-1), while the value '310' (count_1_2, 128-2) received at t512 corresponds to the digital representation of the time of occurrence of rising edge (RE21) of clk_in_2 (101-2). Counters (in count logic, 105, not shown) that are sampled by respective input clocks clk_in_1 and clk_in_2 provide the corresponding count values count_1_1 (128-1) and count_1_2 (128-2) at the respective rising edges of the input clocks clk_in_1 and clk_in_2. As noted above, the counters corresponding to each pair of input clocks are synchronized, i.e., start counting from the same initial value (e.g., zero) and increment at the same rate. Thus, the counters represent time instances on a same time scale.

Counts corresponding to rising edges of clk_in_1 (101-1) are shown as being received at time instants t510, t518 and t526. Thus, count_1_1 (128-1) is shown as having values 289 between t510-t518, 373 between t518-t526 and 457 between t526-t532. Count1_q (306-1) is the value of count_1 (128-1) but delayed by one clock cycle of clk_dig_tdc (107) by flip-flop 305-1. Thus, while count_1 (128-1) has the value 289 starting at t510, count1_q (306-1) is shown as having value 289 starting at t512 (after one cycle of clk_dig_tdc (107)). Accordingly, count1_q (306-1) is shown as having values 289 between t512-t520, 373 between t520-t528 and 457 between t528-t532.

Signal unique_count1 (401-1) is asserted when the value of count_1_1 (128-1) is not equal to the value of count1_q (306-1). In other words, unique_count1 (401-1) is set to a logic HIGH when count of clk_in_1 (101-1) has undergone a change from its value in a previous clock cycle of clk_dig_tdc (107). Accordingly, unique_count1 (401-1) is shown as being asserted only in time intervals t510-t512, t518-t520 and t526-t528, when the value of count_1_1 (128-1) is not equal to the value of count1_q (306-1).

As noted above, unique_count1_q (311-1) is determined based on the following logic:

if (window_identifier && !unique_count1)

unique_count1_$q$=0 else if (unique_count1)

unique_count1_$q$=1     (Logic 1.1)

The above logic is evaluated based on values of window_identifier (232) and unique_count1 (401-1) one clock cycle previous to the current time instant. Thus, at t512, value of window_identifier (232) considered for evaluation is a logic LOW (value in time interval t510-t512) and the value of unique_count1 (401-1) considered for evaluation is a logic HIGH. Accordingly, unique_1-generator 310-1 evaluates Logic 1.1 and sets unique_count1_q (311-1) to a logic HIGH starting at t512.

Counts corresponding to rising edges of clk_in_2 (101-2) are shown as being received at time instants t512, t520 and t528. Thus, count_1_2 (128-2) is shown as having values 310 between t512-t520, 394 between t520-t528 and 478 between t528-t532. Count2_q (306-2) is the value of count_2 (128-2) but delayed by one clock cycle of clk_dig_tdc (107) by flip-flop 305-2. Thus, while count_1_2 (128-2) has the value 310 starting at t512, count2_q (306-2) is shown as having value 310 starting at t514 (after one cycle of clk_dig_tdc (107)). Accordingly, count2_q (306-2) is shown as having values 310 between t514-t522, 394 between t522-t530 and 478 between t530-t532.

Signal unique_count2 (401-2) is asserted when the value of count_1_2 (128-2) is not equal to the value of count2_q (306-2). In other words, unique_count2 (401-2) is set to a logic HIGH when count of clk_in_2 (101-2) has undergone a change from its value in a previous clock cycle of clk_dig_tdc (107). Accordingly, unique_count2 (401-2) is shown as being asserted only in time intervals t512-t514, t520-t522 and t528-t530, when the value of count_1_2 (128-2) is not equal to the value of count2_q (306-2).

As noted above with respect to FIG. 4, unique_count2_q (311-2) is determined based on the following logic:

if (window_identifier && !unique_count2)

unique_count2_$q$=0 else if (unique_count2)

unique_count2_$q$=1     (Logic 1.2)

As noted above with respect to unique_count1_q (311-1), the above logic is evaluated based on values of window_identifier (232) and unique_count2 (401-2) one clock cycle previous to the current time instant. Thus, at t512, value of window_identifier (232) considered for evaluation is a logic LOW (value in time interval t510-t512) and the value of unique_count2 (401-2) considered for evaluation is a logic LOW. Accordingly, unique_2-generator 310-2 evaluates Logic 1.2 and unique_count2_q (311-2) remains at a logic LOW starting at t512.

Similarly, at t514, for the evaluation of Logic 1.2, the value of window_identifier (232) is a logic LOW and the value of unique_count2 (401-2) is a logic HIGH. Accordingly, unique_2-generator 310-2 evaluates the above Logic 1.2 and sets unique_count2_q (311-2) to a logic HIGH starting at t514.

When unique_count2_q (311-2) is set to a logic HIGH at t514, window_identifier (232) also goes to logic HIGH as both unique_count1_q (311-1) and unique_count2_q (311-2) are at logic HIGH. As noted above, window_identifier (232) gets de-asserted at t516, i.e., after one clock cycle of clk_dig_tdc (107).

At t516, for the determination of unique_count1_q (311-1), the value of window_identifier (232) is a logic HIGH and the value of unique_count1 (401-1) is a logic LOW. Accordingly, unique_count1_q (311-1) is set to a logic LOW starting at t516.

At t516, for the determination of unique_count2_q (311-2), the value of window_identifier (232) is a logic HIGH and the value of unique_count2 (401-2) is a logic LOW. Accordingly, unique_count2_q (311-2) is set to a logic LOW starting at t516.

The values for unique_count1_q (311-1), unique_count2_q (311-2) and window_identifier (232) are generated in a similar manner for respective time instants up to t532, as depicted in FIG. 5.

Thus, window_identifier (232) is shown as identifying the boundaries of windows, with each window corresponding to a pair of successive edges of an input clock (clk_in_1, 101-1 in this illustration).

The manner in which unique count signals (410, 311) and signal window_identifier (232) are generated for a pair of input clocks having frequencies that are integer-related multiples is described next.

Figure 6:
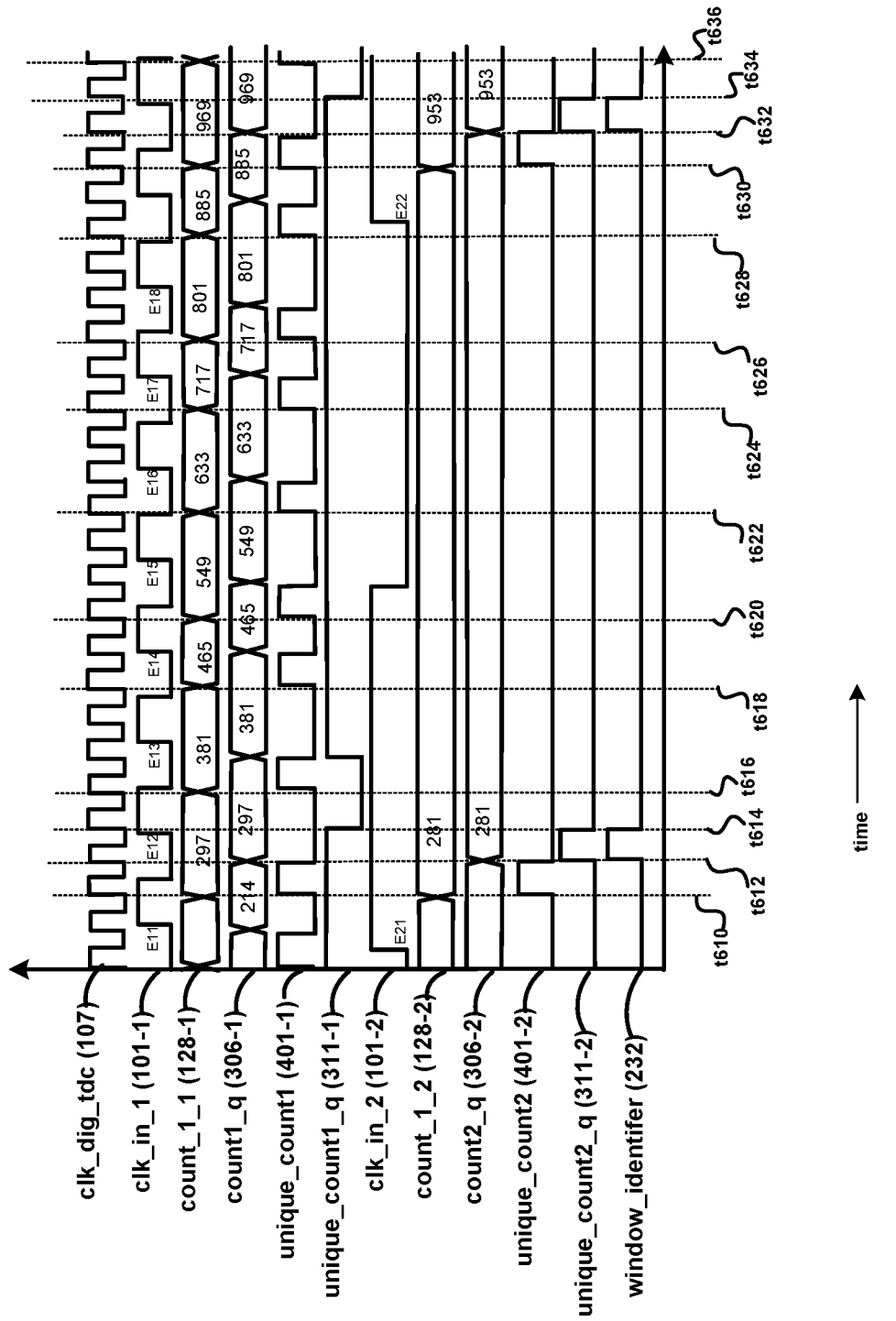
FIG. 6 is a timing diagram illustrating the manner in which a unique-count signal and a window_identifier signal are generated for a pair of input clocks having frequencies that are integer-related multiples greater than one, in an embodiment of the present disclosure.

10. Generation of Unique-Count Signal and Window_Identifier Signal for a Pair of Input Clocks Having Frequencies that are Integer-Related FIG. 6 is a timing diagram (not to scale) illustrating the manner in which unique count signals (410, 311) and signal window_identifier (232) are generated for a pair of input clocks having frequencies that are integer-related multiples, in an embodiment of the present disclosure. In other words, frequency of one input clock (say clk_in_1, 101-1) is M times the frequency of the other input clock (say clk_in_2, 101-2), where M is an integer greater than or equal to 2.

In FIG. 6, M is shown as being 8. Thus, frequency of clk_in_1 (101-1) is 8 times that of clk_in_2 (101-2). Accordingly, 8 rising edges (E11 through E18) of clk_in_1 (101-1) are shown to be present between 2 successive rising edges (E21, E22) of clk_in_2 (101-2).

FIG. 6 shows example waveforms of clk_dig_tdc (107), clk_in_1 (101-1), count_1_1 (128-1), count1_q (306-1), unique_count1 (401-1), unique_count1_q (311-1), clk_in_2 (101-2), count_1_2 (128-2), count2_q (306-2), unique_count2(401-2), unique_count2_q (311-2) and window_identifier (232). In this illustrative embodiment, counts corresponding to input clocks (clk_in_1, 101-1 and clk_in_2, 101-2) are assumed to be of 36 bits.

It is noted here that the rising edges of the input clocks are not synchronous with respect to the measurement clock clk_meas (103) or used in count logic 105 or clk_dig_tdc (107). Accordingly, an uncertainty of up to 3 cycles of clk_dig_tdc (107) may be present between the occurrence of a rising edge and the arrival of the corresponding count. For example, count_1_1 (128-1) corresponding to rising edge E11 of clk_in_1 (101-2) is shown as being received at t610, slightly later than the actual occurrence of the rising edge.

Counts corresponding to rising edges of clk_in_1 (101-1) are shown as being received at time instants t610, t616, t618, t620, t622, t624, t626, t628 and t630. Thus, count_1_1 (128-1) is shown as having values 297 between t610-t616, 381 between t616-618, 465 between t618-t620, 549 between t620-t622, 633 between t622-t624, 717 between t624-t626, 801 between t626-t628, 885 between t628-t630 and 969 between t630-t636. Count1_q (306-1) is the value of count_1_1 (128-1) but delayed by one clock cycle of clk_dig_tdc (107) by flip-flop 305-1. Thus, while count_1_1 (128-1) has the value 297 starting at t610, count1_q (306-1) is shown as having value 297 starting at t612 (after one cycle of clk_dig_tdc (107)). Accordingly, each value of count1_q (306-1) is shown to be delayed by one cycle of clk_dig_tdc (107) with respect to a respective value of count_1_1 (128-1) in FIG. 6.

Signal unique_count1 (401-1) is asserted when the value of count_1_1 (128-1) is not equal to the value of count1_q (306-1). In time interval t610-t612, count_1_1 (128-1) has a value 297 while count1_q (306-1) has a value 214, and therefore unique_count1 (401-1) is shown as being asserted in time interval t610-t612. Each respective value of unique_count1 (401-1) is set to a logic HIGH in a time interval when the corresponding value of count_1_1 (128-1) is not equal to the value of count1_q (306-1) in that time interval.

Prior to t610, unique_count1_q (311-1) is shown as having a logic HIGH value. Unique_count1_q (311-1) is determined according to Logic 1.1 noted above. Logic 1.1 is evaluated based on values of window_identifier (232) and unique_count1 (401-1) one clock cycle previous to the current time instant. Thus, at t612, value of window_identifier (232) considered for evaluation is a logic LOW (value in time interval t610-t612) and the value of unique_count1 (401-1) considered for evaluation is a logic HIGH. Accordingly, unique_1-generator 310-1 evaluates the above logic and continues to keep unique_count1_q (311-1) at a logic HIGH at t612.

At t614, for the determination of unique_count1_q (311-1), the value of window_identifier (232) is a logic HIGH and the value of unique_count1 (401-1) is a logic LOW. Accordingly, unique_1-generator 310-1 evaluates the above logic and de-asserts unique_count1_q (311-1) starting at t614.

Signal unique_count2 (401-2) is asserted when the value of count_1_2 (128-2) is not equal to the value of count1_q (306-2). Thus, unique_count2 (401-2) is shown as being asserted only in time intervals t610-t612 and t630-t632.

Unique_count2_q (311-2) is determined in a manner similar to that of unique_count1_q (311-1). Thus, unique_count2_q (311-2) is shown as being asserted in time interval t612-t614 (as the value of window_identifier, (232) considered for evaluation is a logic LOW and the value of unique_count2 (401-2) considered for evaluation is a logic HIGH). Similarly, unique_count2_q (311-2) is also asserted in time interval t632-t634.

At 612, when unique_count2_q (311-2) is set to a logic HIGH, window_identifier (232) also goes to logic HIGH as both unique_count1_q (311-1) and unique_count2_q (311-2) are at logic HIGH. As noted above, window_identifier (232) gets de-asserted at t614, i.e., after one clock cycle of clk_dig_tdc (107). Similarly, window_identifier (232) gets asserted again in time interval t632-t634.

Phase difference of a pair of input clocks whose frequencies are integer-related multiples is the time between occurrence of an edge of the slower clock and the nearest edge of the faster clock. Thus, window_identifier (232) pulses are shown as being generated upon occurrence of rising edges of clk_in_2 (101-2) (slower clock) in FIG. 6, thus identifying the boundaries of windows for generation of a respective output upon the end of each window.

Rollover of count values is taken into consideration while determining phase difference between inputs. As is well known in the relevant arts, a counter has a finite width and can count only up to a certain maximum value (referred to as full-scale value) as determined by the width of the counter. A rollover event is said to occur when the value of a counter reaches its full-scale value. Thereafter, the counter resets and starts counting from zero again.

If one of the counters corresponding to an input clock has rolled over and the other counter has not rolled over, this may result in calculation error in subtraction-unit 330. In order to prevent such errors, the rollover event needs to be handled. Rollover events are handled by rollover1-generator 315-1, rollover2-generator 315-2 and rollover block 325.

The manner in which rollover is handled in an embodiment of the present disclosure is described next with respect to FIG. 7.

11. Rollover Handling

Figure 7:
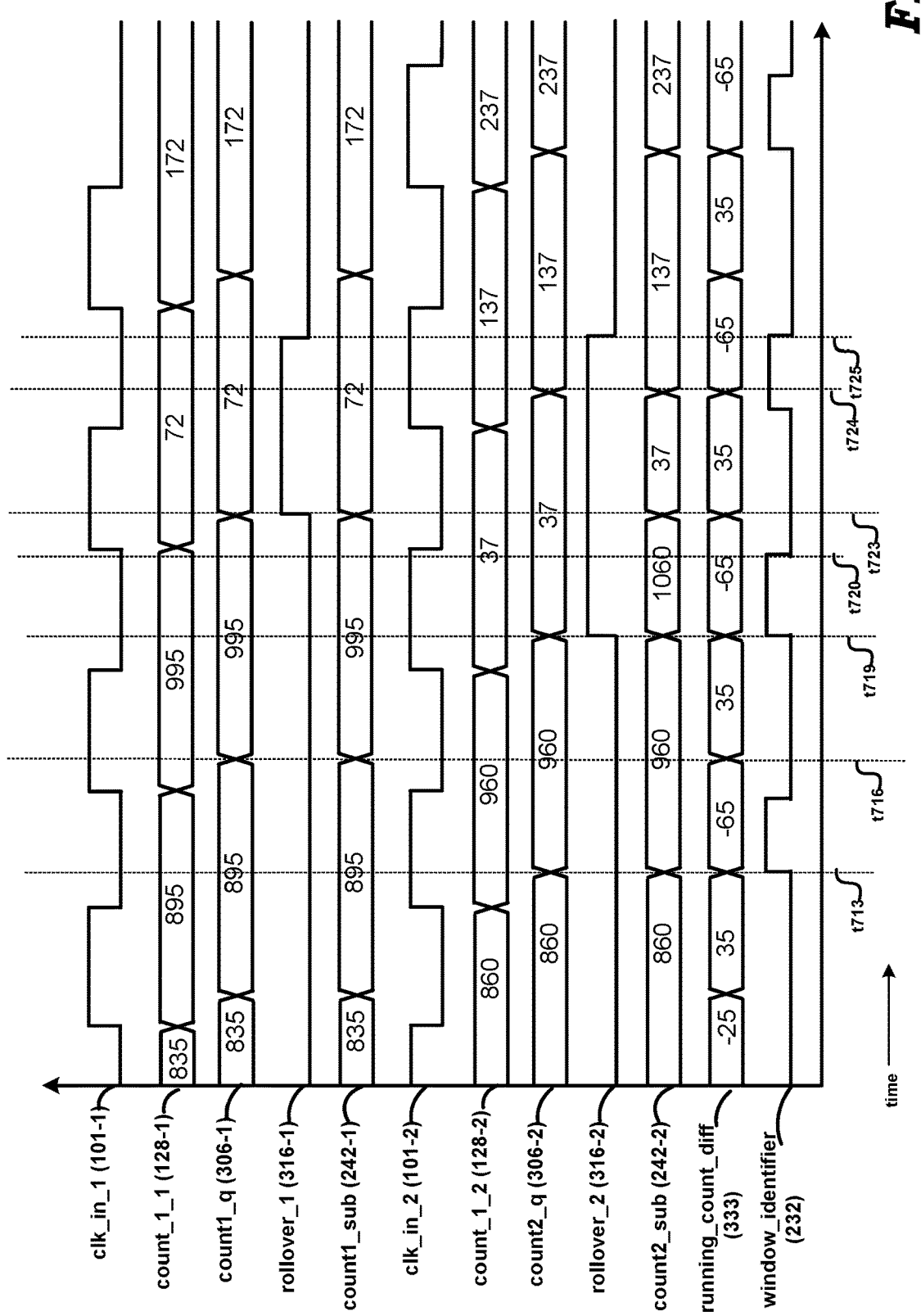
FIG. 7 is a timing diagram illustrating the manner in which rollover of count values is handled in an embodiment of the present disclosure.

FIG. 7 is a timing diagram illustrating the manner in which rollover of count values is handled in an embodiment of the present disclosure. Specifically, the figure is shown containing waveforms clk_in_1 (101-1), count_1_1 (128-1), count1_q (306-1), rollover_1 (316-1), count1_sub (242-1), clk_in_2 (101-2), count_1_2 (128-2), count2_q (306-2), rollover_2 (316-2), count2_sub (242-2), running_count_diff (333) and window_identifier (232). Clk_in_1 (101-1), count_1_1 (128-1), count1_q (306-1), clk_in_2 (101-2), count_1_2 (128-2) and count2_q (306-2) respectively correspond to those in FIGS. 5 and 6, and their description is not repeated here in the interest of brevity.

For ease of understanding, FIG. 7 depicts an example rollover handling for a 10-bit counter in an embodiment of the present disclosure. Thus, a rollover event is said to occur when the value of count reaches 1024. Although the description is provided with respect to 10-bit counters, counters having other widths can be used in other embodiments, as will be apparent to a skilled practitioner by reading the disclosure provided herein.

In an embodiment, rollover1-generator 315-1 determines that a rollover has occurred when the MSB (most significant bit) of count value corresponding to clk_in_1 (101-1) has changed from a value of 1 in a previous clk_dig_tdc (107) (not shown) cycle to a value of 0 in the current clock cycle. Rollover1-generator 315-1 performs this determination by comparing MSB values of count_1_1 (128-1) and count1_q (306-1). Rollover2-generator 315-2 operates in a manner similar to rollover1-generator 315-1 in order to determine if a rollover has occurred for count value corresponding to clk_in_2 (101-2).

In an embodiment of the present disclosure, rollover block 325 implements the following logic to handle rollover events:

If (rollover_1==0 && rollover_2==0)

count1_sub=count1_$q$ count2_sub=count2_$q$

Else if (rollover_1==0 && rollover_2==1)

count1_sub=count1_$q$ count2_sub=count2_$q$+(2^10−1)

Else if (rollover_1==1 && rollover_2==0)

count1_sub=count1_$q$+(2^10−1)

count2_sub=count2_$q$

Else if (rollover_1==1 && rollover_2==1)

count1_sub=count1_$q$ count2_sub=count2_$q$   (Logic 2)

Expression (rollover_1=0 && rollover_2=0) would evaluate to a '1' when both rollover_1 and rollver_2 have a value of logic LOW, and would evaluate to a '0' otherwise. Expression (rollover_1=0 && rollover_2==1) would evaluate to a '1' when rollover_1 has a value of logic LOW and rollver_2 has a value of logic HIGH, and would evaluate to a '0' otherwise. Expression (rollover_1==1 && rollover_2==0) would evaluate to a '1' when rollover_1 has a value of logic HIGH and rollver_2 has a value of logic LOW, and would evaluate to a '0' otherwise. Expression (rollover_1==1 && rollover_2==1) would evaluate to a '1' when both rollover_1 and rollver_2 have a value of logic HIGH, and would evaluate to a '0' otherwise.

Referring to FIG. 7, just prior to t713, both count1_q (306-1) and count_1_1 (128-1) are shown as having the value 895 while both count2_q (306-2) and count_1_2 (128-2) are shown as having the value 960. Accordingly, rollover_1 (316-1) and rollover_2 (316-2) are at logic LOW. Rollover block 325 evaluates logic 2 and determines that count1_sub (242-1) should be set equal to count1_q (306-1) and count2_sub (242-2) should be set equal to count2_q (306-2). Accordingly, subtraction-unit 330 performs the subtraction (895 minus 960), and running_count_diff (333) is shown to be having the value '−65' in time interval t713-t716.

Just prior to t719, count2_q (306-2) is shown to be having a value 960 while count_1_2 (128-2) is shown to be having the value 37. The binary equivalents of the two counts are as shown below:

960: 1111000000

37: 0000100101

Thus, MSB of count_1_2 (128-2) has changed from a value of '1' in a previous clock cycle (indicated by value of count2_q (306-2)) to a value of '0' in the current clock cycle of clk_dig_tdc (107). Therefore, rollover1 generator 315-2 asserts signal rollover_2 (316-2) starting at t719.

Just prior to t719, both count1_q (306-1) and count_1_1 (128-1) are shown to be having the value 995. Therefore, rollover2 generator 315-1 does not assert signal rollover_1 (316-1) at t719.

At t719, inputs to rollover block 325 are accordingly a logic LOW (for rollover_1 (316-1)) and a logic HIGH (for rollover_2 (316-2)). Rollover block 325 evaluates logic 2 and generates outputs:

count1_sub=count1_q (995 in this case)

count2_sub=count2_q+(2^10−1)=(37+1024−1)=1060.

This is depicted in time interval t719-t723 in FIG. 7.

Subtraction-unit 330 receives count1_sub (242-1) and count2_sub (242-2) and generates output (995 minus 1060), i.e., '−65', as depicted in waveform running_count_diff (333) in time interval t719-t723.

Just prior to t723, count1_q (306-1) is shown to be having a value 995 while count_1_1 (128-1) is shown to be having the value 72. Therefore, rollover1-generator 315-1 determines that MSB of count_1_1 (128-1) has changed (from a value of '1' in a previous clock cycle to a value of '0' in the current clock cycle of clk_dig_tdc, 107), and asserts signal rollover_1 (316-1) starting at t723.

At t723, inputs to rollover block 325 are accordingly a logic HIGH (for rollover_1 (316-1)) and a logic HIGH (for rollover_2 (316-2)). Rollover block 325 evaluates logic 2 and generates outputs:

count1_sub=count1_$q$(72 in this example)

count2_sub=count2_$q$(37 in this example)

Subtraction-unit 330 receives count1_sub (242-1) and count2_sub (242-2) and generates output (72 minus 37), i.e., '35', as depicted in waveform running_count_diff (333) in time interval t723-t724.

Signals rollover_1 (316-1) and rollover_2 (316-2) get de-asserted when window_identifier (232) gets de-asserted after a rollover event of counters of both inputs (count_1_1, 128-1 and count_1_2, 128-2). Thus, although window_identifier (232) is shown as being de-asserted at t720, rollover_2 (316-2) continues to remain asserted. At t725, rollover_1 (316-1) and rollover_2 (316-2) are shown as being de-asserted when window_identifier (232) gets de-asserted.

In this manner, rollover1-generator 315-1, rollover2-generator 315-2 and rollover block 325 together ensure that rollover events of respective counters do not result in corresponding calculation errors.

The various blocks of a calculation unit as described in detail above enable TDC 100 in generating digital values representing the phase difference between a pair of periodic inputs whose frequencies are related to each other by an integer value, i.e., whose frequencies are the same or that are integer-related multiples (e.g., 2×, 3×, etc.). The manner in which TDC 100 determines the phase difference for each of the above scenarios is illustrated below with respect to example diagrams.

Figure 8A:
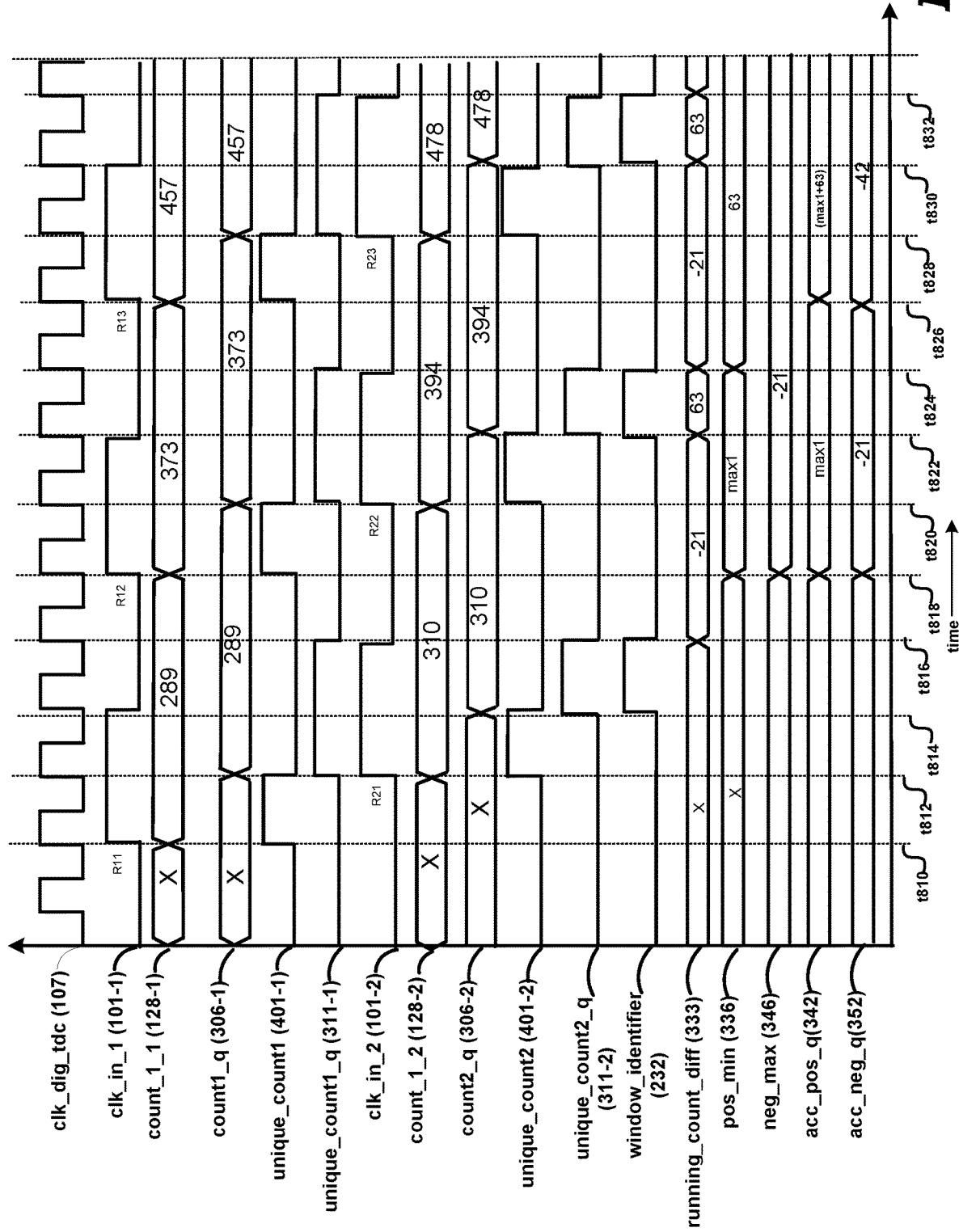
FIG. 8A is a timing diagram illustrating the operation of a TDC for a pair of input clocks having the same frequency, in an embodiment of the present disclosure.

12. Determining Phase Difference Between a Pair of Input Clocks Having the Same Frequency FIG. 8A is an example timing diagram (not to scale) illustrating the manner in which TDC 100 determines the phase difference between a pair of clocks having the same frequency. FIG. 8A shows example waveforms of clk_dig_tdc (107), clk_in_1 (101-1), count_1_1 (128-1), count1_q (306-1), unique_count1 (401-1), unique_count1_q (311-1), clk_in_2 (101-2), count_1_2 (128-2), count2_q (306-2), unique_count2 (401-2), unique_count2_q (311-2) and window_identifier (232). Waveforms clk_dig_tdc (107), clk_in_1 (101-1), count_1 (128-1), count1_q (306-1), unique_count1 (401-1), unique_count1_q (311-1), clk_in_2 (101-2), count_1_2 (128-2), count2_q (306-2), unique_count2 (401-2), unique_count2_q (311-2) and window_identifier (232) correspond to those shown in FIG. 6 and their description is not repeated here in the interest of brevity.

Additionally, FIG. 8A shows example waveforms running_count_diff (333), pos_min (336), neg_max (346), acc_pos_q (342) and acc_neg_q (352). A value of 'X' in data waveforms (count_1_1 (128-1), count1_q (306-1), count_1_2 (128-2), count2_q (306-2), running_count_diff (333), pos_min (336), neg_max (346), acc_pos_q (342), acc_neg_q (352)) indicates a 'don't-care' value for the purpose of this illustration. Value 'max1' in data waveform pos_min (336) represents the maximum positive value of counts (count_1_1 (128-1) and count_1_2 (128-2)), i.e., ($2^{36}-1$) in this case.

Rising edges R11 through R13 of clk_in_1 (101-1) are shown to be occurring at respective time instants t810, t818 and t826. Accordingly, digital core 110 receives values of count_1_1 (128-1) as 289, 373 and 457 respective to each rising edge of clk_in_1 (101-1).

Similarly, rising edges R21 through R23 of clk_in_2 (101-2) are shown to be occurring at respective time instants t812, t820 and t828. Accordingly, digital core 110 receives values of count_1_2 (128-2) as 310, 394 and 478, respective to each rising edge of clk_in_2 (101-2). Thus, in the illustrative embodiment, clk_in_2 (101-2) is shown to be lagging in phase (by approximately 90 degrees) with respect to clk_in_1 (101-1).

Although counts (count_1_1, 128-1 and count_1_2, 128-2) corresponding to rising edges of input clocks (clk_in_1, 101-1 and clk_in_2, 101-2) are shown to be received synchronous with the respective rising edges, in practice, counts may be received slightly later than the occurrence of corresponding rising edges of clk_in_1 (101-1) and clk_in_2 (102-2).

In response to count_1_2 (128-2) changing its value (to 310) at t812, window_identifier (232) is asserted at t814 for one clock cycle of clk_dig_tdc (107). Thus, starting at t816, phase differences between clk_in_1 (101-1) and clk_in_2 (101-2) are measured.

Running_count_diff (333) is shown as having the following values in respective time intervals, based on value of (count1_q (306-1) minus count2_q (306-2)) in the durations (based on pipeline delay noted above):

t816-t818: running_count_diff(333)=289-310=−21
t818-t820: running_count_diff(333)=289-310=−21
t820-t822: running_count_diff(333)=289-310=−21
t822-t824: running_count_diff(333)=373-310=63

The phase difference in duration t816-t822 represents the phase difference between rising edge R21 of clk_in_2 (101-2) and rising edge R11 of clk_in_1 (101-1), while the phase difference in duration t822-t824 represents the phase difference between rising edge R12 of clk_in_2 (101-2) and rising edge R12 of clk_in_1 (101-1).

At t818, positive-min-generator 335 receives a logic HIGH on path 232 (window_identifier) and a value of '−21' on path 333 (running_count_diff). Therefore, positive-min-generator 335 sets the value of pos_min (336) to max1 at t818.

At t820, positive-min-generator 335 receives a logic LOW on path 232 (window_identifier) and a value of '−21' on path 333 (running_count_diff). Therefore, positive-min-generator retains the current value of pos_min (336), i.e., max1, at t820. In this manner, values of pos_min (336) are shown to be updated based on values of window_identifier (232), running_count_diff (333) and the current value of pos_min (336).

At t818, negative-max-generator 345 receives a logic HIGH on path 232 (window_identifier) and a value of '−21' on path 333 (running_count_diff). Therefore, negative-max-generator 345 sets the value of neg_max (346) to the value of running_count_diff (333), i.e., '−21'.

At t820, negative-max-generator 345 receives a logic LOW on path 232 (window_identifier) and a value of '−21' on path 333 (running_count_diff). Therefore, negative-max-generator 345 retains the current value of neg_max (346), i.e., '−21' at t820. In this manner, values of neg_max (346) are shown to be updated/retained based on values of window_identifier (232), running_count_diff (333) and the current value of neg_max (346).

When TDC 100 operates in mode (3) (single-shot continuous mode), output generator block 290 (specifically, single-shot-data generator 355) forwards the absolute minimum of pos_min (336) and neg_max (346) on path 155-1-5 as an output of the sequence of outputs, with each output corresponding to a respective window determined by window-identifier-block 320. Thus, in the above example, the value of '−21' would be output on path 155-1-5. Since the time resolution of counters is 62.5 pico-seconds in this illustrative embodiment, a value of 21 indicates that the phase difference between the pair of input clocks is (21*62.5 pico-seconds), i.e., 1312.5 pico-seconds.

Using similar operations as illustrated above, TDC 100 determines the phase difference between periodic clock inputs having equal frequencies for other values of phase difference (leading or lagging).

The manner in which TDC 100 determines the phase difference between a pair of input clocks having frequencies that are integer-related multiples (2x or greater) is illustrated next with an example.

Figure 8B:
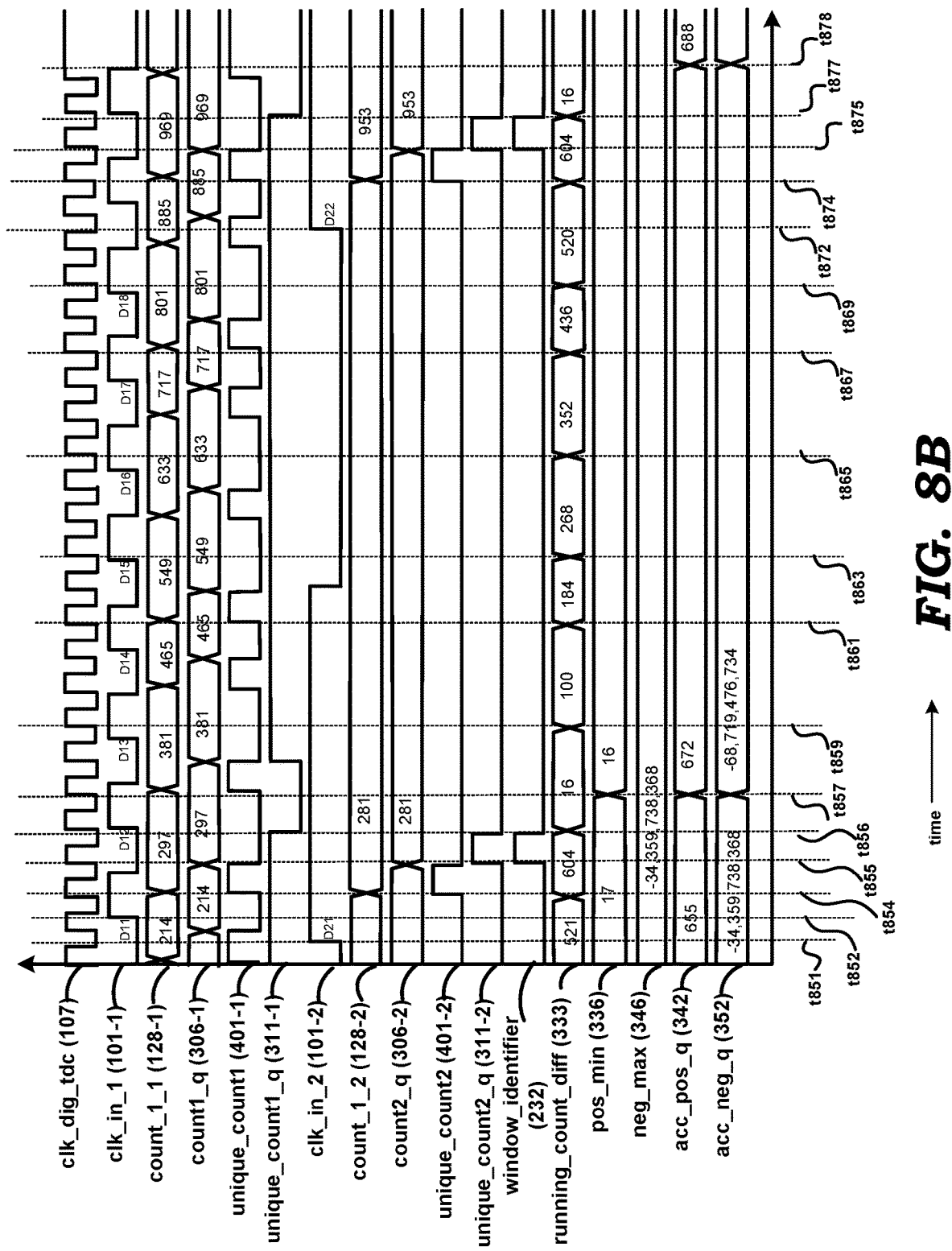
FIG. 8B is a timing diagram illustrating the operation of a TDC for a pair of input clocks having frequencies that are integer-related, in an embodiment of the present disclosure.

13. Determining Phase Difference Between a Pair of Input Clocks Having Frequencies that are Integer-Related Multiples FIG. 8B is a timing diagram (not to scale) illustrating the manner in which TDC 100 measures phase differences between a pair of clocks having frequencies that are integer-related multiples. FIG. 8B shows example waveforms of clk_dig_tdc (107), clk_in_1 (101-1), count_1_1 (128-1), count1_q (306-1), unique_count1 (401-1), unique_count1_q (311-1), clk_in_2 (101-2), count_1_2 (128-2), count2_q (306-2), unique_count2 (401-2), unique_count2_q (311-2), window_identifier (232), running_count_diff (333), pos_min (336), neg_max (346), acc_pos_q (342) and acc_neg_q (352). The waveforms correspond to those shown in FIG. 8A and their description is not repeated here in the interest of brevity. In this illustrative embodiment, counts corresponding to input clocks (clk_in_1, 101-1 and clk_in_2, 101-2) are assumed to be of 36 bits.

As noted above with respect to FIG. 6, frequency of clk_in_1 (101-1) is shown as being 8 times that of clk_in_2 (101-2). Accordingly, 8 rising edges (D11 through D18) of clk_in_1 (101-1) are shown to be present between 2 consecutive rising edges (D21, D22) of clk_in_2 (101-2).

Also, as noted above with respect to FIG. 6, count_1_1 (128-1) and count_1_2 (128-2) are received slightly later than the occurrence of corresponding rising edges of clk_in_1 (101-1) and clk_in_2 (102-2) respectively. Thus, count_1_1 (128-1) received at t854 corresponds to rising edge D11 of clk_in_1 (101-1) shown to be occurring at t852, while count_1_2 (128-2) received at t854 corresponds to rising edge D21 of clk_in_2 (101-2) shown to be occurring at t851.

In response to count_1_2 (128-2) changing its value (to 281) at t854, window_identifier (232) is asserted at t855 for one clock cycle of clk_dig_tdc (107). Thus, starting at t856 (one clock cycle after window_identifier, 232, is asserted), phase differences are measured between rising edge D21 of slower clock clk_in_2 (101-2) and each rising edge (D11 through D18) of faster clock clk_in_1 (101-2) present between two successive edges D21 and D22 of slower clock clk_in_2 (101-2).

Running_count_diff (333) is shown as having the following values in respective time intervals, based on value of (count1_q (306-1) minus count2_q (306-2)) in the durations (based on pipeline delay noted above):

t856-t859: running_count_diff(333)=297−281=16
t859-t861: running_count_diff(333)=381−281=100
t861-t863: running_count_diff (333)=465−281=184
t863-t865: running_count_diff(333)=549−281=268
t865-t867: running_count_diff(333)=633−281=352
t867-t869: running_count_diff(333)=717−281=436
t869-t874: running_count_diff(333)=801−281=520
t874-t877: running_count_diff(333)=885−281=604

Thus, running_count_diff (333) is shown as having 8 distinct values, with each value representing the phase difference between rising edge D21 of clk_in_2 (101-2) and a corresponding one of rising edges D11 through D18 (of clock clk_in_1, 101-1).

Prior to t857, pos_min (336) is shown as having a value of 17 as a result of a previous (not shown) minimum phase difference between two consecutive rising edges of clk_in_2 (101-2). At t857, positive-min-generator 335 receives the value of running_count_diff (333) as 16 and a logic HIGH on path 232 (window_identifier), Therefore, positive-min-generator 335 updates pos_min (336) to the value of running_count_diff (333), i.e., 16, at t857. Between t857 and t876, since none of running_count_diff (333) values exceeds the current value of 16, positive-min-generator 335 retains the value of pos_min (336) at its current value, i.e., 16.

Prior to t857, neg_max (346) is shown as having a large negative value of $(-2^{36-1})$. Starting at t857, since all phase difference values are positive, negative-max-generator 345 retains neg_max (346) at the large negative value.

At t875, window_identifier (232) signal is asserted again, indicating the occurrence of the next rising edge (D22) of clk_in_2 (101-2). It may be observed that the value of 16 is the minimum phase difference amongst all 8 differences measured between two window_identifier (232) pulses. Accordingly, phase difference between clk_in_1 (101-2) and clk_in_2 (101-2) is determined to be 16 at t875. As noted above, phase difference of a pair of input clocks whose frequencies are integer-related multiples is the time between occurrence of an edge of the slower clock and the nearest edge of the faster clock.

Thus, when TDC 100 operates in mode (3) (single-shot continuous mode), Output generator block 290 (specifically, single-shot-data generator 355) forwards the absolute minimum of pos_min (336) and neg_max (346) on path 155-1-5. Thus, in the above example, the value of '16' would be output on path 155-1-5. Since the time resolution of counters is 62.5 pico-seconds in this illustrative embodiment, a value of 16 indicates that the phase difference between the pair of input clocks is (16*62.5 pico-seconds), i.e., 1000 pico-seconds.

According to another aspect of the present disclosure, TDC 100 accumulates a pre-determined (provided by user) number of phase differences between input clocks (clk_in_1, 01-1 and clk_in_2, 101-2) and averages the accumulated value (i.e., accumulated value divided by the number of phase difference samples) in order to potentially improve resolution with which the phase difference can be determined. The manner in which such accumulation is implemented is described next with an example.

14. Accumulation of Phase Difference Samples

Figure 9:
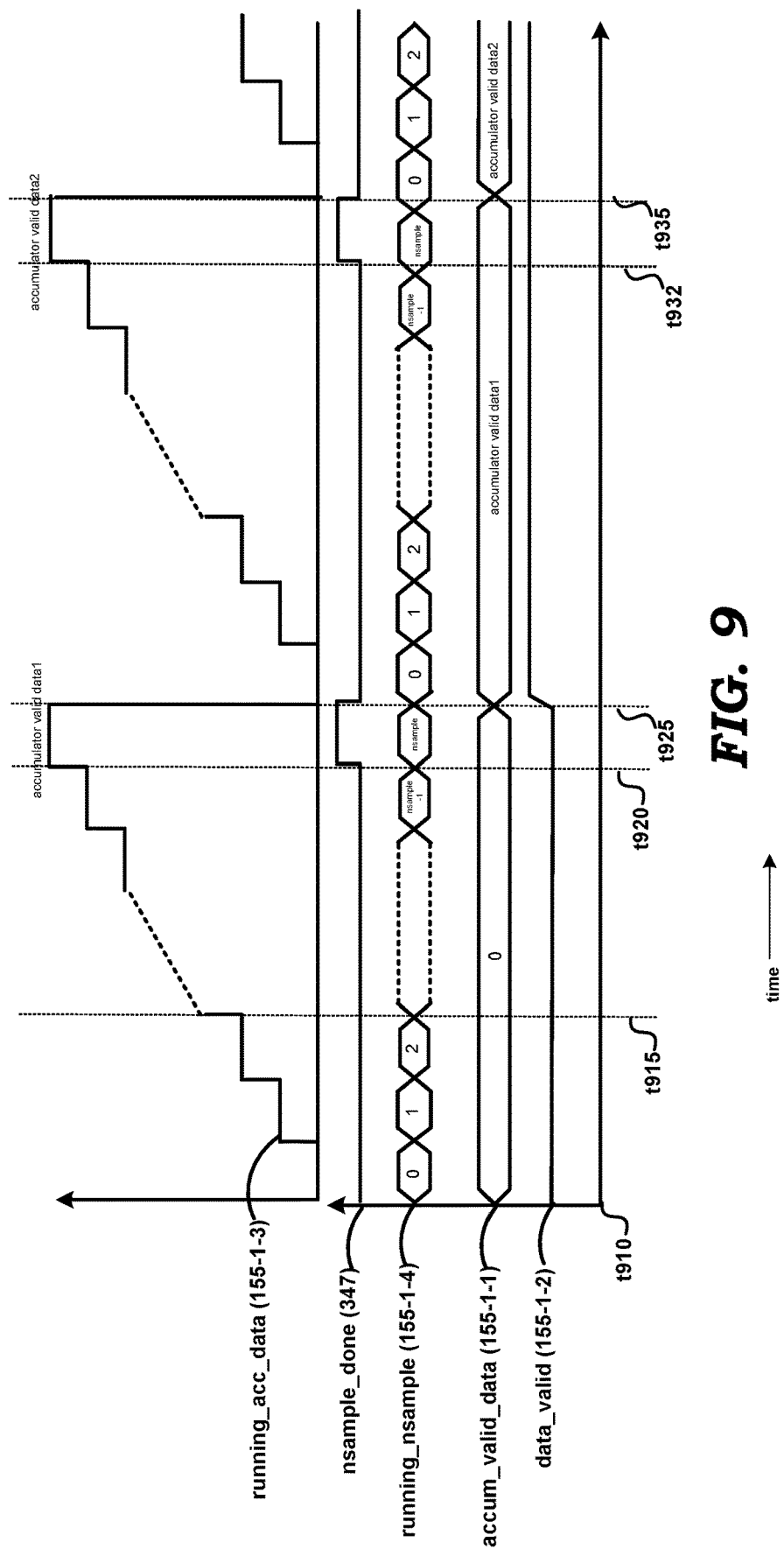
FIG. 9 is a timing diagram illustrating the manner in which phase difference samples are accumulated, in an embodiment of the present disclosure.

FIG. 9 is a timing diagram (not to scale) illustrating accumulation of phase difference samples in an embodiment of the present disclosure. Specifically, the figure is shown containing waveforms running_acc_data (155-1-3), nsample_done (347), running_nsample (155-1-4), accum_valid_data (155-1-1) and data_valid (155-1-2). Waveforms 155-1-1, 155-1-2, 155-1-3 and 155-1-2 are available in modes (1) and (2) (noted above) of TDC 100.

As noted earlier with respect to FIG. 3B, running-accumulator-data-generator 365 generates running_acc_data (155-1-3) and running_nsample (155-1-4). Running_acc_data (155-1-3) represents the accumulated phase difference value upon the end of each window.

Running_acc_data (155-1-3) is desirable in situations where input clocks (clk_in_1, 101-1 and clk_in_2, 101-2) have small frequencies (such as ~1 Hertz) and the user has programmed a relatively high number (say, 1024) of pre-determined number of phase difference samples to be accumulated. Each accumulation cycle would accordingly be of a duration of 1024 seconds. In such cases, the user is required to wait for 1024 seconds (after start of an accumulation cycle) before accumulated data is available on output path 155-1-1 (accum_valid_data). Meanwhile, if the user desires to check an intermediate accumulated value (say at around 3 seconds or 10 seconds after start of the accumulation cycle), the user can do so by reading accumulated data available on path 155-1-3 (running_acc_data) upon the end of any desired number of windows.

Referring to FIG. 9, two accumulation cycles are shown, one between time interval t910-t925 and the next one between t925-t935). Accordingly, nsample_done (347) is asserted at time instants t920 and t932.

Accumulated data is available on path 155-1-1 by time instant t925 (at the end of first accumulation cycle in duration t910-t925), and is held at that value (accumulator valid data1) until the next accumulation cycle is complete (in this case, until t935). At t925, data_valid (155-1-2) is also asserted to indicate that data available on path 155-1-1 is valid. If the user reads output on path 155-1-1 during time interval t925-t935, the user is provided with value (accumulator valid data1) updated at t925.

In mode (1), referring to FIG. 8A, when accumulation cycle ends at t830 (based on pre-determined number of phase difference samples, provided as user input), accumulator-valid-data-generator 375 determines the absolute minimum of acc_pos_q (342) and acc_neg_q (352), and provides the value on path 155-1-1 (accum_valid_data). Thus, the value of '−21' is provided as accum_valid_data (155-1-1), starting at t830 until the end of the next accumulation cycle.

In mode (2), referring to FIG. 8B, prior to t857, acc_pos_q (342) is shown as having a value of 655 as a result of previous accumulation (not shown). At t855, window_identifier (232) is asserted, and therefore at t857, pos_min (336) value is added to the current accumulated value. Thus, starting at t857, acc_pos_q (342) is shown to be having the value (655+17), i.e., 672. At t878, after window_identifier (232) is asserted at t875, pos_min (336) value is added to the current accumulated value. Thus, starting at t878, acc_pos_q (342) is shown to be having the value (672+16), i.e., 688.

Continuing to refer to FIG. 8B, prior to t857, acc_neg_q (352) is shown as having a large negative value of $(-2^{36-1})$ as a result of previous accumulation (not shown). At t855, window_identifier (232) is asserted, and therefore at t857, neg_max (346) value is added to the current accumulated value. Thus, starting at t857, acc_neg_q (352) is shown to be having the value −68,719,476,734.

Thus, when the accumulation cycle ends at t875 (based on pre-determined number of phase difference samples, provided as user input), accumulator-valid-data-generator 375 determines the absolute minimum of acc_pos_q (342) and acc_neg_q (352), and provides the value on path 155-1-1 (accum_valid_data). Thus, the value of 672 is provided as accum_valid_data (155-1-1), starting at t878 until the end of the next accumulation cycle.

Running_nsample (155-1-4) value is incremented every time window_identifier (232) (not shown) is asserted. Each value of data running_acc_data (155-1-3) is also updated every time window_identifier (232) is asserted (upon the end of each window). Thus, if the user desires to check the accumulated value between the start and end of an accumulation cycle, the user may read running_acc_data on path 155-1-3. Running_nsample data available on path 155-1-4 indicates the number of accumulated samples available on path 155-1-3.

For example, referring now to FIG. 9, if the user reads running_acc_data (155-1-3) at time instant t915, running_nsample (155-1-4) indicates that 2 samples have been accumulated and the absolute minimum value of acc_pos_q (342) and acc_neg_q (352) is available on path 155-1-3 (running_acc_data).

In mode (1), referring to FIG. 8A, accumulator-positive 340 and accumulator-negative 350 respectively accumulate pos_min (336) and neg_max (346) values, as depicted in FIG. 8A. For running accumulator data provided as output on path 155-1-3, absolute minimum of instantaneous values of acc_pos_q (342) and acc_neg_q (352) would be determined. Thus, running_acc_data (155-1-3) provides a value of '−21' in time duration t818-t826, and a value of '42' in time duration t826-t832. In mode (2), referring to FIG. 8B, running_acc_data (155-1-3) provides a value of 655 in time duration t857-t878, and a value of 672, starting at t878.

In this manner, TDC 100 provides accumulated data in accumulator modes (1) and (2). The description is continued to illustrate the manner in which TDC 100 generates output in continuous single-shot mode of operation.

15. Single-Shot Continuous Mode Output

Figure 10:
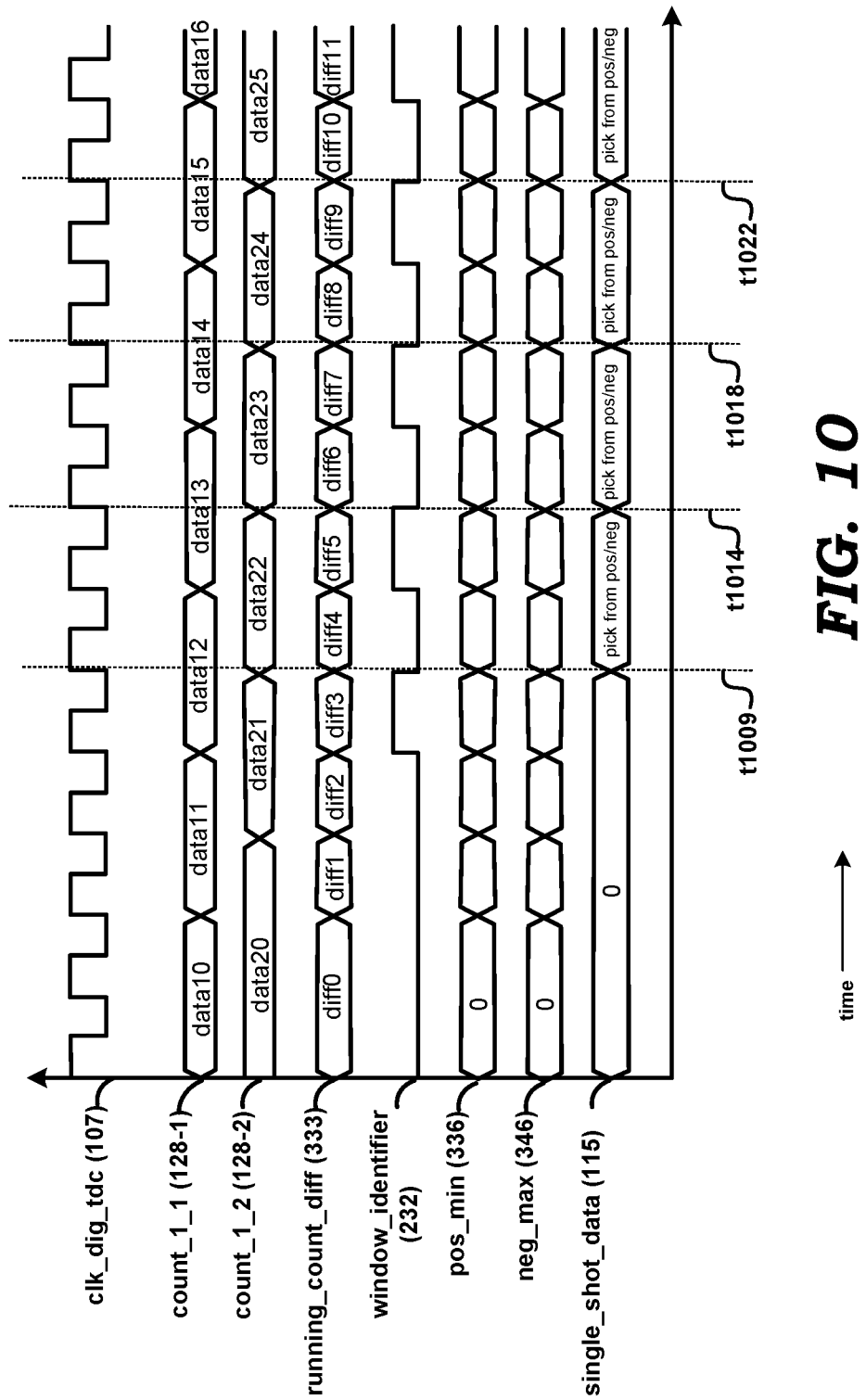
FIG. 10 is a timing diagram illustrating the manner in which phase difference is generated in single-shot continuous mode of TDC, in an embodiment of the present disclosure.

FIG. 10 is a timing diagram (not to scale) illustrating the manner in which calculation unit 150 provides output in single-shot continuous mode of operation (mode (3)). Specifically, the figure is shown containing waveforms clk_dig_tdc (107), count_1_1 (128-1), count_1_2 (128-2), running_count_diff (333), window_identifier (232), pos_min (336), neg_max (346) and single_shot_data (115).

Counts data10 through data16 respectively correspond to rising edges of clk_in_1 (101-1, not shown), while counts data20 through data25 respectively correspond to rising edges of clk_in_1 (101-1, not shown). Running_count_diff (333) is shown as being computed as diff0 through diff11, with each difference representing a difference in counts between corresponding input clocks (as described in detail with respect to FIGS. 8A and 8B). The values of pos_min (336) and neg_max (346), though not shown, are also determined as described in detail with respect to FIGS. 8A and 8B.

Single-shot-data-generator 355 receives pos_min on path 336, neg_max on path 346 and running_count_diff on path 333, and generates single_shot_data on path 115. Upon the end of each window (as determined by window_identifier 232), single-shot-data-generator 355 determines an absolute minimum value of pos_min (336) and neg_max (346) and provides the absolute minimum value on path 115. This mode of operation may be suitable in cases where the input clocks have the same frequency, and the average frequency of input clocks remains constant but the instantaneous phase difference changes continuously/is fluctuating.

In mode (4), calculation unit 150 operates on pulse inputs, as noted above. Thus, single-shot-data-generator 355 forwards running_count_diff (333) as a one-time phase difference between the pulses, and provides the phase difference on path 115 (single_shot_data).

In this manner, aspects of the present disclosure enable a TDC to measure phase difference between periodic inputs.

TDC 100 implemented as described above can be incorporated in a larger device or system as described briefly next.

16. System

Figure 11:
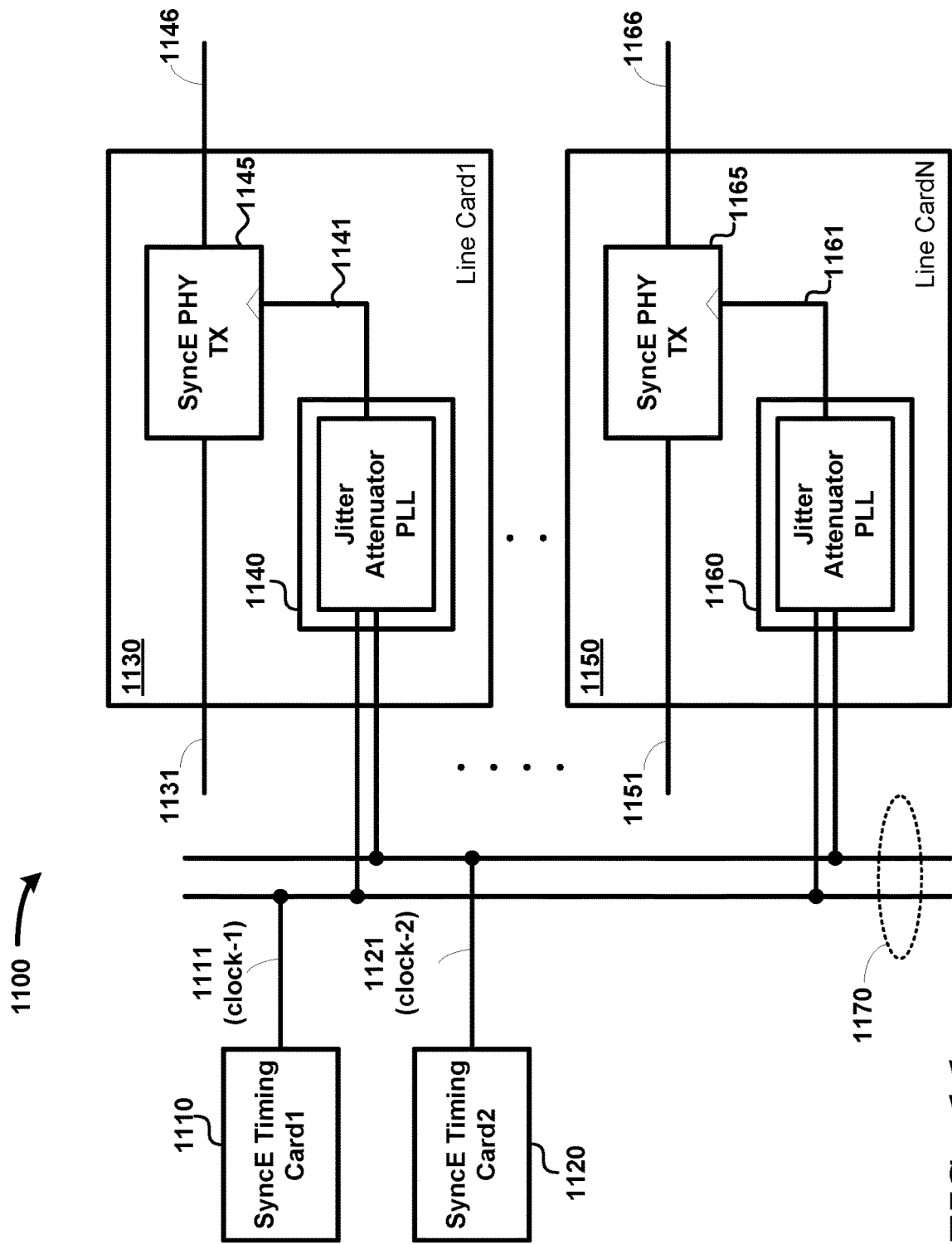
FIG. 11 is a block diagram of a system in which a device implemented according to several aspects of the present disclosure can be incorporated, in an embodiment of the present disclosure.

FIG. 11 is a block diagram of an example system containing a TDC implemented according to various aspects of the present disclosure, as described in detail above. System 1100 is shown containing SyncE (Synchronous Ethernet) timing cards (1110 and 1120) and line cards 1 through N, of which only two line cards 1130 and 1150 are shown for simplicity. Line card 1130 is shown containing jitter attenuator PLL 1140 and SyncE PHY Transmitter 1145. Line card 1150 is shown containing jitter attenuator PLL 1160 and SyncE PHY Transmitter 1155. The components of FIG. 11 may operate consistent with the Synchronous Ethernet (SyncE) network standard.

As is well known in the relevant arts, SyncE is a physical layer (PHY)-based technology for achieving synchronization in packet-based Ethernet networks. The SyncE clock signal transmitted over the physical layer should be traceable to an external master clock (for example, from a timing card such as card 1110 or 1120). Accordingly, Ethernet packets are re-timed with respect to the master clock, and then transmitted in the physical layer. Thus, data packets (e.g., on path 1131 and 1132) are re-timed and transmitted without any time stamp information being recorded in the data packet. The packets may be generated by corresponding applications such as IPTV (Internet Protocol Television), VoIP (Voice over Internet Protocol), etc.

Thus, line card 1130 receives a packet on path 1131, and forwards the packet on output 1146 after the packet has been re-timed (synchronized) with a master clock. Similarly, line card 1150 receives a packet on path 1151, and forwards the packet on output 1166 after the packet has been re-timed (synchronized) with a master clock.

The master clock (1111/clock-1) is generated by timing card 1110. Timing card 1120 generates a redundant clock (1121/clock-2) that is to be used by line cards 1130 and 1150 upon failure of master clock 1111. Master clock 1111 and redundant clock 1121 are provided via a backplane (represented by numeral 1170) to each of lines cards 1130 and 1150.

In line card 1130, jitter attenuator PLL 1140 contains TDC 100 as the phase detector for detecting phase differences between the selected one of input clocks clock-1/clock-2, and output clock 1141, with TDC 100 being as described above in detail. PLL 1140 generates an output clock 1141 which is used to synchronize (re-time) packets received on path 1131 and forwarded as re-timed packets on path 1146.

Similarly, in line card 1150, jitter attenuator PLL 1160 contains TDC 100 as the phase detector for detecting phase difference between the selected one of input clocks clock-1/clock-2, and output clock 1161, described above in detail, and receives clocks 1111 and 1121, described above in detail, and receives clocks 1111 and 1121. PLL 1160 generates an output clock 1161 which is used to synchronize (re-time) packets received on path 1151 and forwarded as re-timed packets on path 1166. Upon being out of phase-lock, PLL 1160 is designed to provide locking of phase in the manner described above in detail.

17. Conclusion

References throughout this specification to "one embodiment", "an embodiment", or similar language means that a particular feature, structure, or characteristic described in connection with the embodiment is included in at least one embodiment of the present disclosure. Thus, appearances of the phrases "in one embodiment", "in an embodiment" and similar language throughout this specification may, but do not necessarily, all refer to the same embodiment.

While in the illustrations of FIGS. 1A, 1B, 2A, 3A, 3B and 4, although terminals/nodes are shown with direct connections to (i.e., "connected to") various other terminals, it should be appreciated that additional components (as suited for the specific environment) may also be present in the path, and accordingly the connections may be viewed as being "electrically coupled" to the same connected terminals.

While various embodiments of the present disclosure have been described above, it should be understood that they have been presented by way of example only, and not limitation. Thus, the breadth and scope of the present disclosure should not be limited by any of the above-described embodiments, but should be defined only in accordance with the following claims and their equivalents.

What is claimed is:

1. A time-to-digital converter (TDC), said TDC comprising:
  a count logic to generate a first sequence of counts and a second sequence of counts respectively for a first periodic signal and a second periodic signal received as input signals, said first sequence of counts representing respective time instances on a time scale at which a first sequence of edges with a first direction of said first periodic signal occur, said second sequence of counts representing respective time instances on said time scale at which a second sequence of edges with said first direction of said second periodic signal occur; and
  a digital core to generate a sequence of outputs representing the phase differences between said first periodic signal and said second periodic signal from said first sequence of counts and said second sequence of counts,
  wherein each output of said sequence of outputs is generated from a pair of successive edges of said first direction of one of the periodic signals and an individual one of the other periodic signal occurring between the pair, wherein said output is set equal to the minimum of difference of the individual one with the first value of the pair and the individual one with the second value of the pair.

2. The TDC of claim 1, said digital core comprising:
  an input analyzer block to receive said first sequence of counts and said second sequence of counts, wherein said input analyzer block determines corresponding boundaries of a plurality of windows, wherein said boundaries of each window of said plurality of windows indicate respective time instances of occurrence of said pair of successive edges; and
  an output block to receive said boundaries of said plurality of windows and to generate said sequence of outputs, wherein said output block generates said each output of said sequence of outputs upon the end of said each window of said plurality of windows.

3. The TDC of claim 2, wherein said input analyzer block comprises a window-identifier-block to determine said plurality of windows, wherein said output block comprises:
  a subtraction block to receive a first subset of said first sequence of counts and a second subset of said second sequence of counts in each window of said plurality of windows, wherein said subtraction block generates a plurality of differences between said first subset of counts and said second subset of counts;
  a positive-minimum-generator to receive said plurality of differences and to generate a positive-minimum value representing the least value of all positive values comprised in said plurality of differences;
  a negative-maximum-generator to receive said plurality of differences and to generate a negative-maximum value representing the maximum value of all negative values comprised in said plurality of differences; and
a single-shot-data-generator to receive said positive-minimum value and said negative-maximum value, and to forward the absolute minimum of said positive minimum value and said negative maximum value as said each output.

4. The TDC of claim 3, wherein said input analyzer block receives a master clock from said count logic, said input analyzer block further comprising:
a first unique-count-generator to indicate the availability of a next count in said first sequence of counts; and
a second unique-count-generator to indicate the availability of a next count in said second sequence of counts,
wherein said window-identifier-block determines each window in said plurality of windows as an interval between time instances indicating availability of both of said next count in said first sequence of counts and said next count in said second sequence of counts.

5. The TDC of claim 4, wherein said output block further comprises:
accumulation logic to provide a running sum of a desired number of said outputs spanning multiple windows in said plurality of windows, wherein said accumulation logic receives an indication of said desired number from an external unit.

6. The TDC of claim 5, said accumulation logic to receive a respective sequence of each of said positive-minimum value and said negative-maximum value, to add values in each of said respective sequence, and to generate the absolute minimum of the two added values as said running sum,
wherein a length of each of said respective sequences is less than or equal to said desired number.

7. The TDC of claim 6, wherein said first periodic signal and said second periodic signal have a same frequency in a first duration.

8. The TDC of claim 6, wherein said first periodic signal has a frequency of N times the frequency of said second periodic signal in a second duration, wherein N is greater than or equal to 2,
wherein said pair of successive edges are of said second periodic signal and said individual one is of said first periodic signal,
wherein a respective plurality of clock cycles of said first periodic signal are present between said pair of successive edges, wherein said individual one is the earliest or last edge of said plurality of clock cycles which is closer in time to either of said pair of successive edges.

9. The TDC of claim 1, wherein said edges with said first direction correspond to rising edges of said first periodic signal and said second periodic signal.

10. A circuit comprising:
a TDC to generate a sequence of outputs representing the phase differences at respective time instances between a first periodic signal and a second periodic signal received as input signals,
wherein each output of the sequence represents the minimal time difference between occurrence of each of two consecutive edges of a same direction of said first periodic signal and a third edge of said same direction of said second periodic signal, with said third edge occurring between said two consecutive edges; and
a processing block to process said sequence of outputs.

11. The circuit of claim 10, wherein said circuit is a phase locked loop, and said processing block operates to minimize any phase differences between said first periodic signal and said second periodic signal represented by said sequence of outputs.

12. The circuit of claim 10, wherein said TDC comprises:
a count logic to generate a first sequence of counts and a second sequence of counts respectively for said first periodic signal and said second periodic signal, said first sequence of counts representing respective time instances on a time scale at which a first sequence of edges with a first direction of said first periodic signal occur, said second sequence of counts representing respective time instances on said time scale at which a second sequence of edges with said first direction of said second periodic signal occur; and
a digital core to generate said sequence of outputs representing the phase differences between said first periodic signal and said second periodic signal from said first sequence of counts and said second sequence of counts.

13. The circuit of claim 12, said digital core comprising:
an input analyzer block to receive said first sequence of counts and said second sequence of counts, wherein said input analyzer block determines corresponding boundaries of a plurality of windows, wherein said boundaries of each window of said plurality of windows indicate respective time instances of occurrence of said pair of successive edges; and
an output block to receive said boundaries of said plurality of windows and to generate said sequence of outputs, wherein said output block generates said each output of said sequence of outputs upon the end of said each window of said plurality of windows.

14. The circuit of claim 13, wherein said input analyzer block comprises a window-identifier-block to determine said plurality of windows, wherein said output block comprises:
a subtraction block to receive a first subset of said first sequence of counts and a second subset of said second sequence of counts in each window of said plurality of windows, wherein said subtraction block generates a plurality of differences between said first subset of counts and said second subset of counts;
a positive-minimum-generator to receive said plurality of differences and to generate a positive-minimum value representing the least value of all positive values comprised in said plurality of differences;
a negative-maximum-generator to receive said plurality of differences and to generate a negative-maximum value representing the maximum value of all negative values comprised in said plurality of differences; and
a single-shot-data-generator to receive said positive-minimum value and said negative-maximum value, and to forward the absolute minimum of said positive minimum value and said negative maximum value as said each output.

15. The TDC of claim 14, wherein said input analyzer block receives a master clock from said count logic, said input analyzer block further comprising:
a first unique-count-generator to indicate the availability of a next count in said first sequence of counts; and
a second unique-count-generator to indicate the availability of a next count in said second sequence of counts,
wherein said window-identifier-block determines each window in said plurality of windows as an interval between time instances indicating availability of both of said next count in said first sequence of counts and said next count in said second sequence of counts.

16. The TDC of claim 15, wherein said output block further comprises:

accumulation logic to provide a running sum of a desired number of said outputs spanning multiple windows in said plurality of windows, wherein said accumulation logic receives an indication of said desired number from an external unit.

17. The TDC of claim 16, said accumulation logic to receive a respective sequence of each of said positive-minimum value and said negative-maximum value, to add values in each of said respective sequence, and to generate the absolute minimum of the two added values as said running sum, wherein a length of each of said respective sequences is less than or equal to said desired number.

18. The TDC of claim 17, wherein said first periodic signal and said second periodic signal have a same frequency in a first duration.

19. The TDC of claim 17, wherein said first periodic signal has a frequency of N times the frequency of said second periodic signal in a second duration, wherein N is greater than or equal to 2, wherein said pair of successive edges are of said second periodic signal and said third edge is of said first periodic signal, wherein a respective plurality of clock cycles of said first periodic signal are present between said pair of successive edges, wherein said third edge is the earliest or last edge of said plurality of clock cycles which is closer in time to either of said pair of successive edges.

20. The TDC of claim 10, wherein said edges with said first direction correspond to rising edges of said first periodic signal and said second periodic signal.

\* \* \* \* \*

UNITED STATES PATENT AND TRADEMARK OFFICE
CERTIFICATE OF CORRECTION

PATENT NO. : 11,592,786 B1
APPLICATION NO. : 17/662667
DATED : February 28, 2023
INVENTOR(S) : Behera et al.

Page 1 of 1

It is certified that error appears in the above-identified patent and that said Letters Patent is hereby corrected as shown below:

On the Title Page

Column 1, above Int. Cl., Line 27, insert Item (30) -- Sep. 30, 2021 (IN) ............... 202141044473 --, therefor Signed and Sealed this
Twenty-eighth Day of January, 2025

Coke Morgan Stewart
*Acting Director of the United States Patent and Trademark Office*